United States Patent
Li

(10) Patent No.: US 8,369,156 B2
(45) Date of Patent: Feb. 5, 2013

(54) FAST RANDOM ACCESS TO NON-VOLATILE STORAGE

(75) Inventor: Yan Li, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 327 days.

(21) Appl. No.: 12/835,315

(22) Filed: Jul. 13, 2010

(65) Prior Publication Data

US 2012/0014186 A1 Jan. 19, 2012

(51) Int. Cl.
*G11C 16/06* (2006.01)
(52) U.S. Cl. ......... 365/185.25; 365/185.03; 365/185.21; 365/203
(58) Field of Classification Search ............. 365/185.25, 365/185.18, 185.21, 185.03, 203, 204
See application file for complete search history.

(56) References Cited

U.S. PATENT DOCUMENTS

| | | | |
|---|---|---|---|
| 7,177,977 B2 | 2/2007 | Chen et al. | |
| 7,196,928 B2 | 3/2007 | Chen | |
| 7,280,396 B2 | 10/2007 | Li et al. | |
| 7,581,057 B2 | 8/2009 | Sinclair et al. | |
| 7,606,076 B2 | 10/2009 | Nguyen et al. | |
| 2004/0057285 A1 | 3/2004 | Cernea et al. | |
| 2005/0030814 A1 | 2/2005 | Oh et al. | |
| 2005/0210184 A1* | 9/2005 | Chen et al. | 711/103 |
| 2009/0323421 A1 | 12/2009 | Lee et al. | |
| 2010/0329031 A1* | 12/2010 | Lee | 365/185.22 |
| 2011/0063920 A1* | 3/2011 | Moschiano et al. | 365/185.21 |

OTHER PUBLICATIONS

International Search Report and Written Opinion of the International Searching Authority dated Nov. 24, 2011, PCT International Application No. PCT/US2011/043540 filed Jul. 11, 2011, 8 pages.

* cited by examiner

*Primary Examiner* — Toan Le
(74) *Attorney, Agent, or Firm* — Vierra Magen Marcus & DeNiro LLP

(57) ABSTRACT

Techniques are disclosed herein for efficiently operating memory arrays of non-volatile storage devices. In one embodiment, when reading data from an MLC block, reading is sped up by not discharging bit lines between successive sensing operations. For example, all even bit lines are charged up and odd bit lines are grounded to set up sensing of memory cells that are associated with a first word line and the even bit lines. Then, memory cells associated with the first word line and the even bit lines are read by, for example, sensing the even bit lines. Then, while the even bit lines are still charged, memory cells associated with another word line and the even bit lines are read. Because the even bit lines remain charged between the two sensing operations, time is saved in not having to re-charge the bit lines to an appropriate level for sensing.

32 Claims, 18 Drawing Sheets

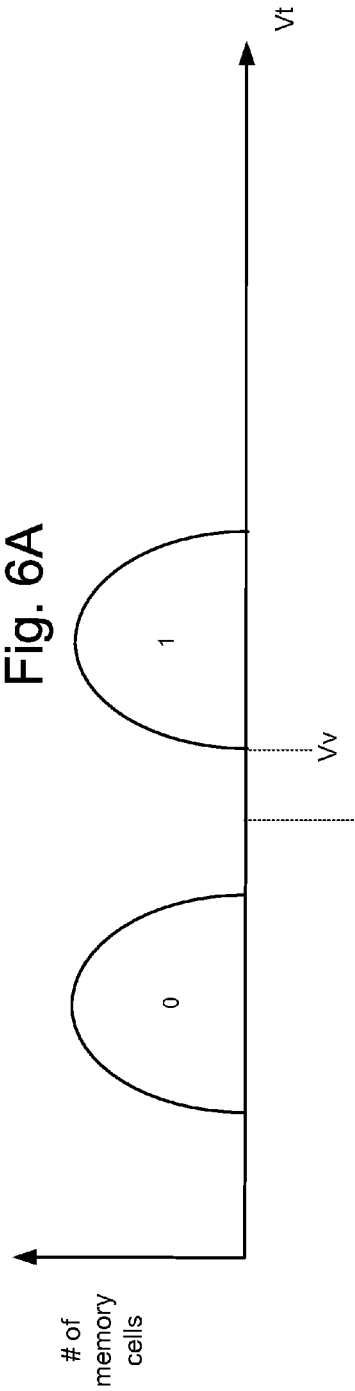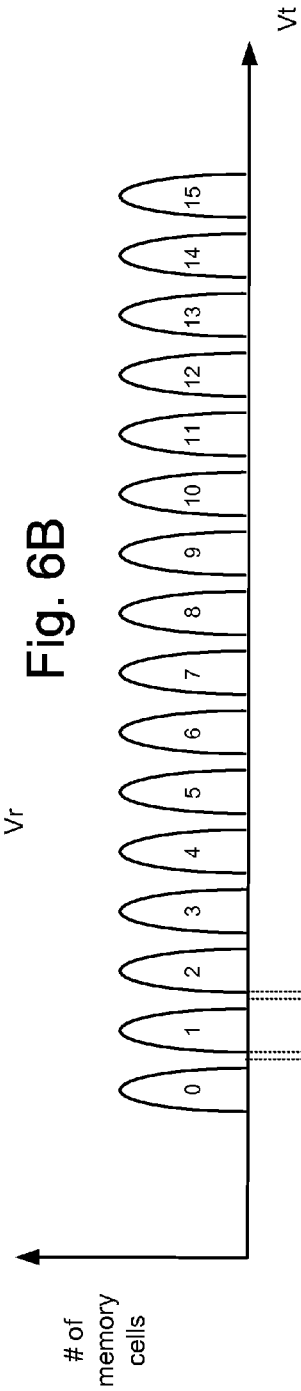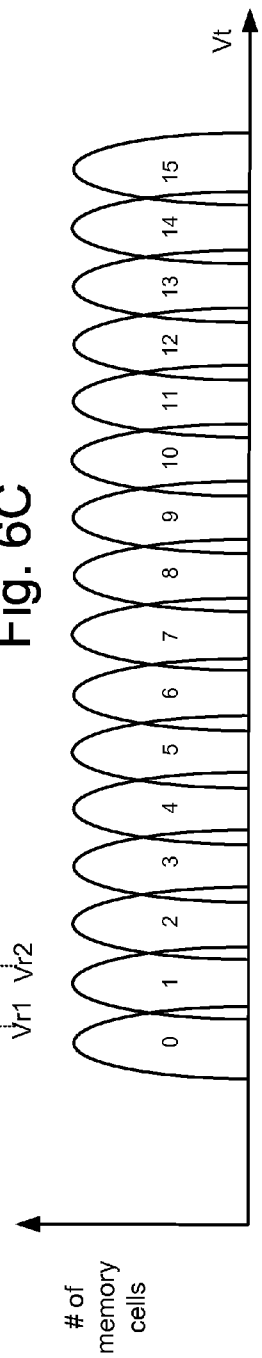

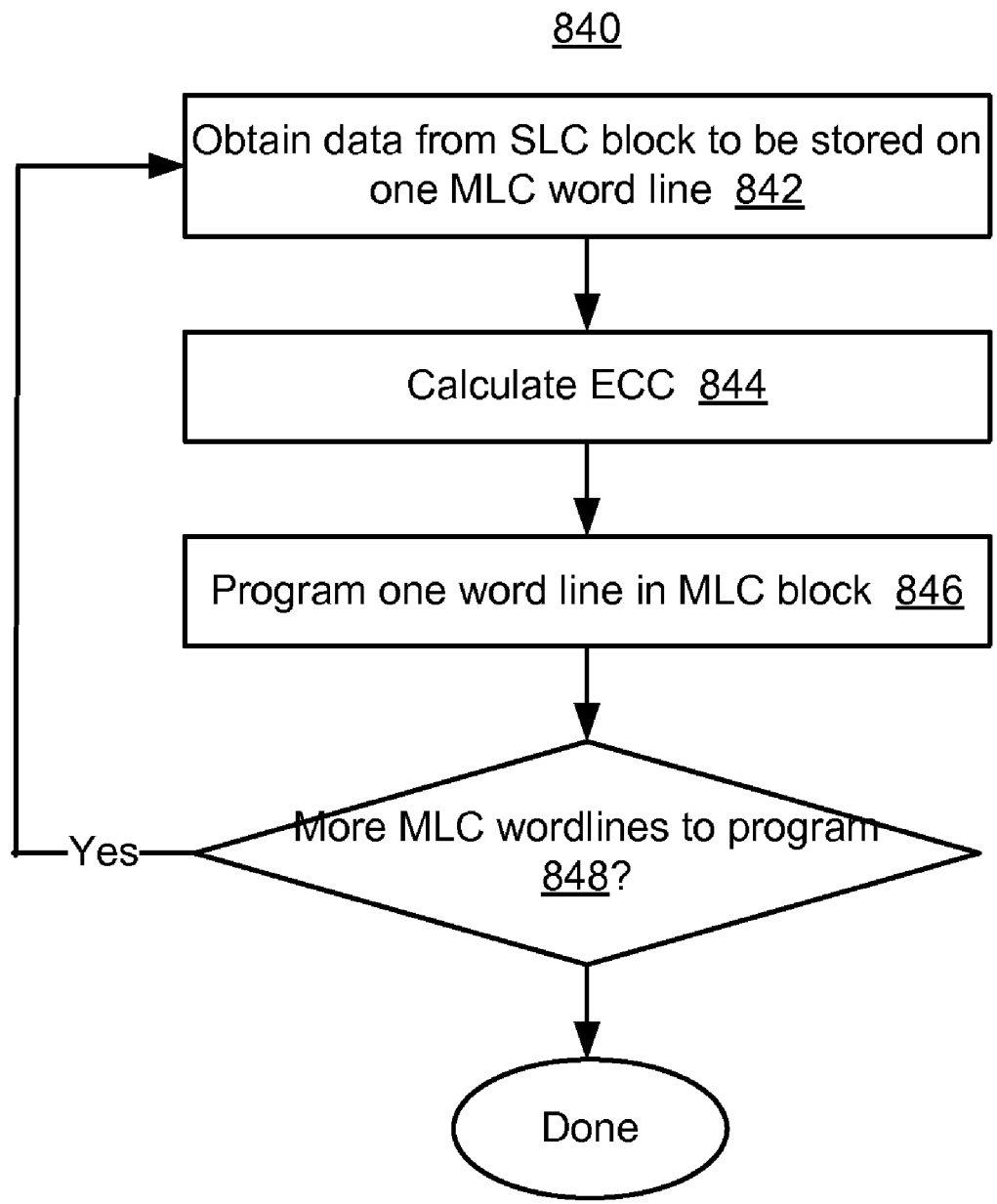

FAST RANDOM ACCESS TO NON-VOLATILE STORAGE

BACKGROUND

1. Field of the Invention
The present disclosure relates to non-volatile storage.

2. Description of the Related Art
Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Memory cells having a threshold voltage within a first voltage range may be considered to be in the erased state and those having a threshold voltage within a second voltage range may be considered to be in the programmed state. Typically, there is a window between the first and second range. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Some flash memory devices operate as both binary and multi-states. For example, some memory cells (or groups of memory such as "blocks") are used to store one bit of data ("single-level cell or SLC blocks") and other memory cells are used to store multiple bits per cell ("multi-level cell or MLC blocks"). The SLC blocks may be used for short term storage of data, whereas the MLC blocks may be used for long term data storage.

For some memory arrays, the memory array is arranged as a number of parallel word lines and a number of bit lines that run perpendicular to the word lines. Each memory cell may be associated with one word line and one bit line. The memory array is oftentimes read with an operation that reads many different memory cells in unison. For example, all of the memory cells on a given word line might be read at the same time. As another alternative, every other memory cell on a given word line might be read at the same time. For example, first memory cells on a selected word line that are associated with the odd bit lines are read, then memory cells on the selected word line that are associated with the even bit lines are read.

Unfortunately, access time may be slower than desired in some cases. One possible approach to decrease access time is to read word lines ahead of time. For example, word lines are read sequentially, where reading of memory cells on the next word line in sequence is begun prior to determining that the next word line in the sequence actually contains the next data of interest. This approach can sometimes decrease access time. However, this approach might not decrease access time if the next word line does not contain data of interest. For example, if the data of interest is randomly scattered on different word lines, then reading ahead successive word lines may not be beneficial. Note that in some cases, the address of the next data that should be read is not known until after the first data is read. Therefore, reading ahead to the next word line does not necessarily save time for some data accesses, such as random data access.

BRIEF DESCRIPTION OF THE DRAWINGS

FIGS. 6A, 6B, 6C, and 6D depict example threshold voltage distributions.

FIG. 8C is a flowchart illustrating one embodiment of a process of transferring data from one or more SLC blocks to one or more MLC blocks.

DETAILED DESCRIPTION

Figure 1:
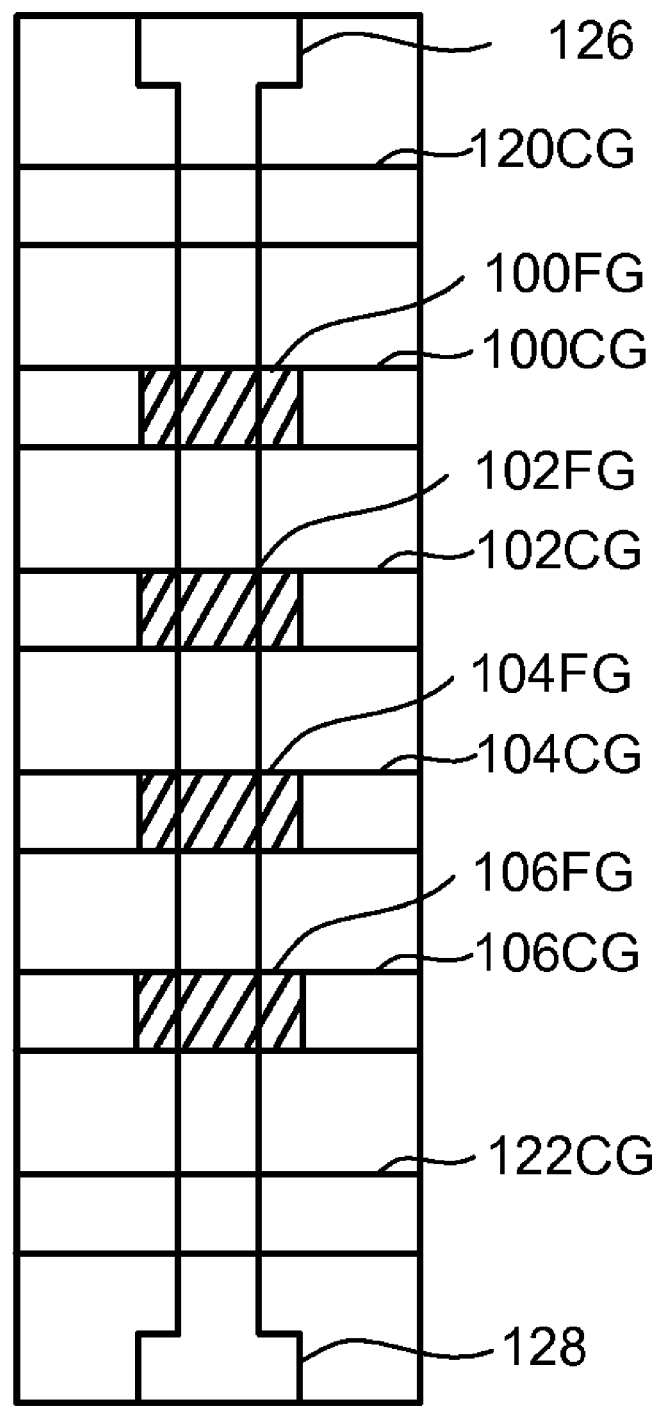
FIG. 1 is a top view of a NAND string.

Techniques are disclosed herein for efficiently operating memory arrays of non-volatile storage devices. In some embodiments, data that is to be programmed into the memory array is first stored in SLC blocks and later transferred to MLC blocks. The data may be programmed into the SLC blocks and MLC blocks in a way that allows faster access of the data from the MLC blocks. While techniques may be applied to any type of data access, there may be additional benefits when the data is randomly accessed from different word lines in the MLC blocks.

In one embodiment, when reading data from an MLC block, reading is sped up by not discharging bit lines between successive sensing operations of memory cells on different word lines. For example, all even bit lines are charged up and odd bit lines are grounded to set up sensing of memory cells that are associated with a first word line and the even bit lines. Then, memory cells associated with the first word line and the even bit lines are read by, for example, sensing the even bit lines. Then, while the even bit lines are still charged, memory cells associated with another word line and the even bit lines are read. Because the even bit lines remain charged between the two sensing operations, time is saved in not having to re-charge the bit lines to an appropriate level for sensing. Note that for some memory arrays, the RC time constant associated with the bit lines can be significant. In some embodiments, data from the first read is used to determine the address of the next read. For example, the data is used to determine what word line should be read next.

In one embodiment, the way the data is arranged when programming MLC blocks increases the probability that if memory cells associated with odd (or even) bit lines are being read the next data to be read during a random access is also in memory cells associated with odd (or even) bit lines. Therefore, successive reads of memory cells associated with odd bit lines (but different word lines) may be performed. Note that the next word line to be read is not required to be an adjacent word line. Rather, there might be many word lines intervening the two word lines read. In fact, the second word line might even be in a different block of memory cells.

In one embodiment, when programming in the SLC blocks, a first contiguous chunk of data (e.g., one data file) is programmed into memory cells associated with even bit lines, without programming data from that data file into memory cells on the odd bit lines. A second contiguous chunk of data (e.g., another data file) is programmed into memory cells associated with the odd bit lines, without programming data from that data file into memory cells on the even bit lines. In some embodiments, every other word line is programmed in the SLC blocks. However, if even word lines are programmed when programming the even bit lines, then odd word lines are programmed when programming the even bit lines. This may result in a checkerboard programming pattern. In some embodiments, all word lines are programmed in the SLC blocks. When transferring the data to an MLC block, programming a selected word line in the MLC block may be as follows. Data in memory cells associated with the even bit lines in the SLC block is programmed into memory cells associated with even bit lines in the MLC block. Also, data in memory cells associated with the odd bit lines in the SLC block may be programmed into memory cells associated with odd bit lines in the MLC block. This may held to keep the first contiguous chunk of data (e.g., first data file) on the even bit lines in the MLC block and the second contiguous chunk of data (e.g., second data file) on the odd bit lines in the MLC block. A net result of this is that the data stored in memory cells on a selected word line in the MLC block may come from two different contiguous chunks.

The techniques described herein are applicable to a wide range of memory arrays. The following is one example NAND architecture. However, techniques described herein are not limited to this example or to the NAND architecture in general. One example of a flash memory system uses the NAND structure, which includes arranging multiple floating gate transistors in series between two select gates. The transistors in series and the select gates are referred to as a NAND string. FIG. 1 is a top view showing one NAND string. The NAND string depicted in FIG. 1 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2:
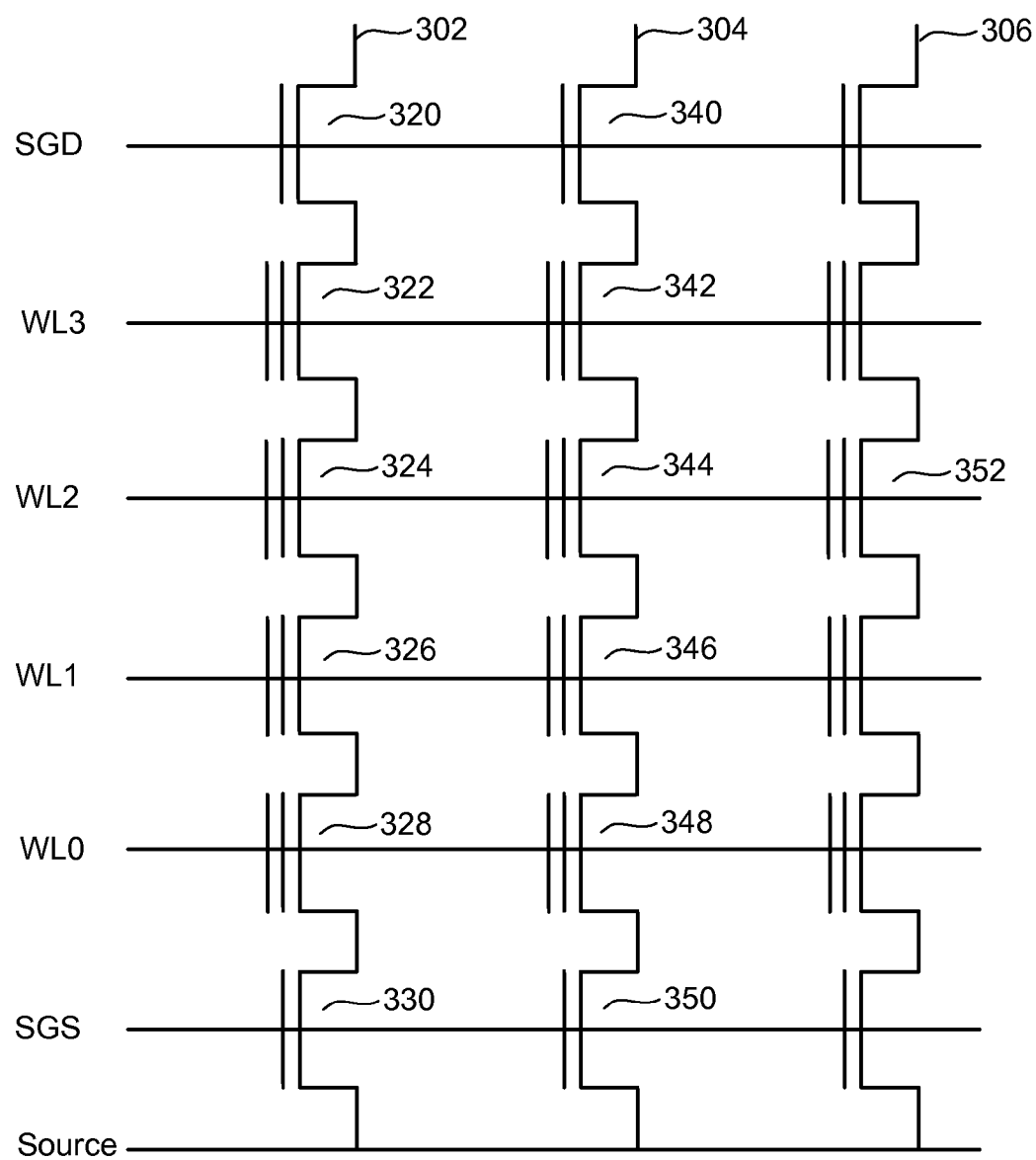
FIG. 2 is a circuit diagram of three NAND strings with associated word lines.

FIG. 2 shows three NAND strings 302, 304 and 306 of a memory array having many more NAND strings. Each of the NAND strings of FIG. 2 includes two select transistors and four memory cells. For example, NAND string 302 includes select transistors 320 and 330, and memory cells 322, 324, 326 and 328. NAND string 304 includes select transistors 340 and 350, and memory cells 342, 344, 346 and 348. Each NAND string is connected to the source line by its select transistor (e.g. select transistor 330 and select transistor 350). A selection line SGS is used to control the source side select gates. The various NAND strings are connected to respective bit lines by select transistors 320, 340, etc., which are controlled by select line SGD. In other embodiments, the select lines do not necessarily need to be in common. Word line WL3 is connected to the control gates for memory cell 322 and memory cell 342. Word line WL2 is connected to the control gates for memory cell 324, memory cell 344, and memory cell 352. Word line WL1 is connected to the control gates for memory cell 326 and memory cell 346. Word line WL0 is connected to the control gates for memory cell 328 and memory cell 348. As can be seen, each bit line and the respective NAND string comprise the columns of the array of memory cells. The word lines (WL3, WL2, WL1 and WL0) comprise the rows of the array.

Note that a NAND string can have fewer or more memory cells than depicted in FIG. 2. For example, some NAND strings will include eight memory cells, 16 memory cells, 32 memory cells, 64 memory cells, 128 memory cells, etc. The discussion herein is not limited to any particular number of memory cells in a NAND string. Furthermore, a word line can have more or fewer memory cells than depicted in FIG. 2. For example, a word line can include thousand or tens of thousands of memory cells. The discussion herein is not limited to any particular number of memory cells in a word line.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
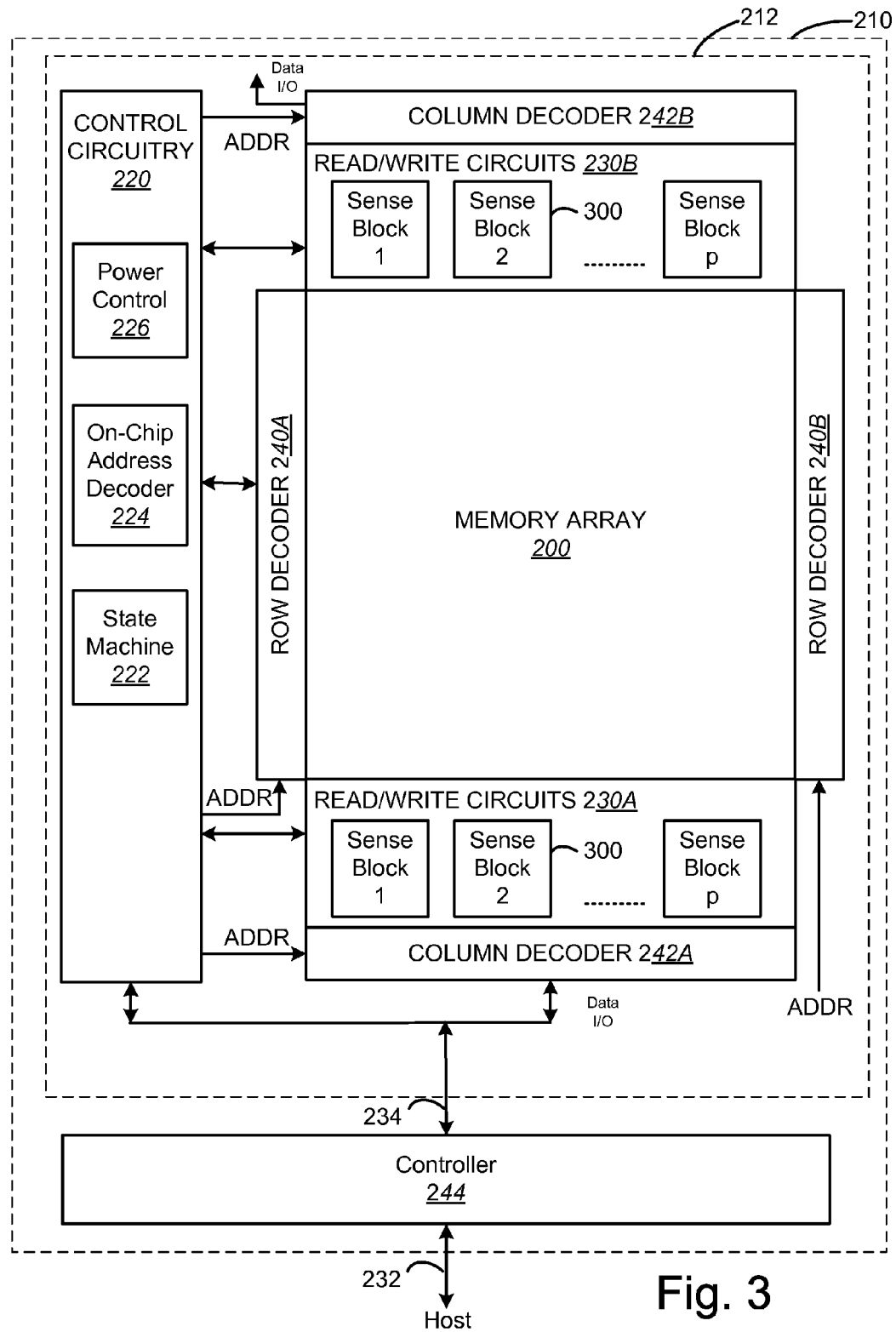
FIG. 3 is a block diagram of an array of NAND flash storage elements.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In some embodiments, all blocks in memory array 200 can be used as either SLC or MLC blocks. For example, a block can be used as an SLC block at one time and as an MLC block at another time. In other embodiments, the controller 244 defines certain blocks as SLC and MLC blocks respectively. In some embodiments, when the controller 244 receives user data it is first stored in one or more SLC blocks. However, the controller 244 does not necessarily program all of the memory cells in the SLC block. In one aspect, the controller 244 programs only certain memory cells. Various example patterns for programming SLC blocks are discussed below.

At some point, the controller 244 may transfer the user data stored in one or more of the SLC blocks into one or more MLC blocks. Note that it is not required that all of the memory cells in the SLC block are programmed prior to the transfer to the MLC block. Also note that this technique may result in data being stored in MLC blocks for longer periods of time than in SLC blocks, but that is not required.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
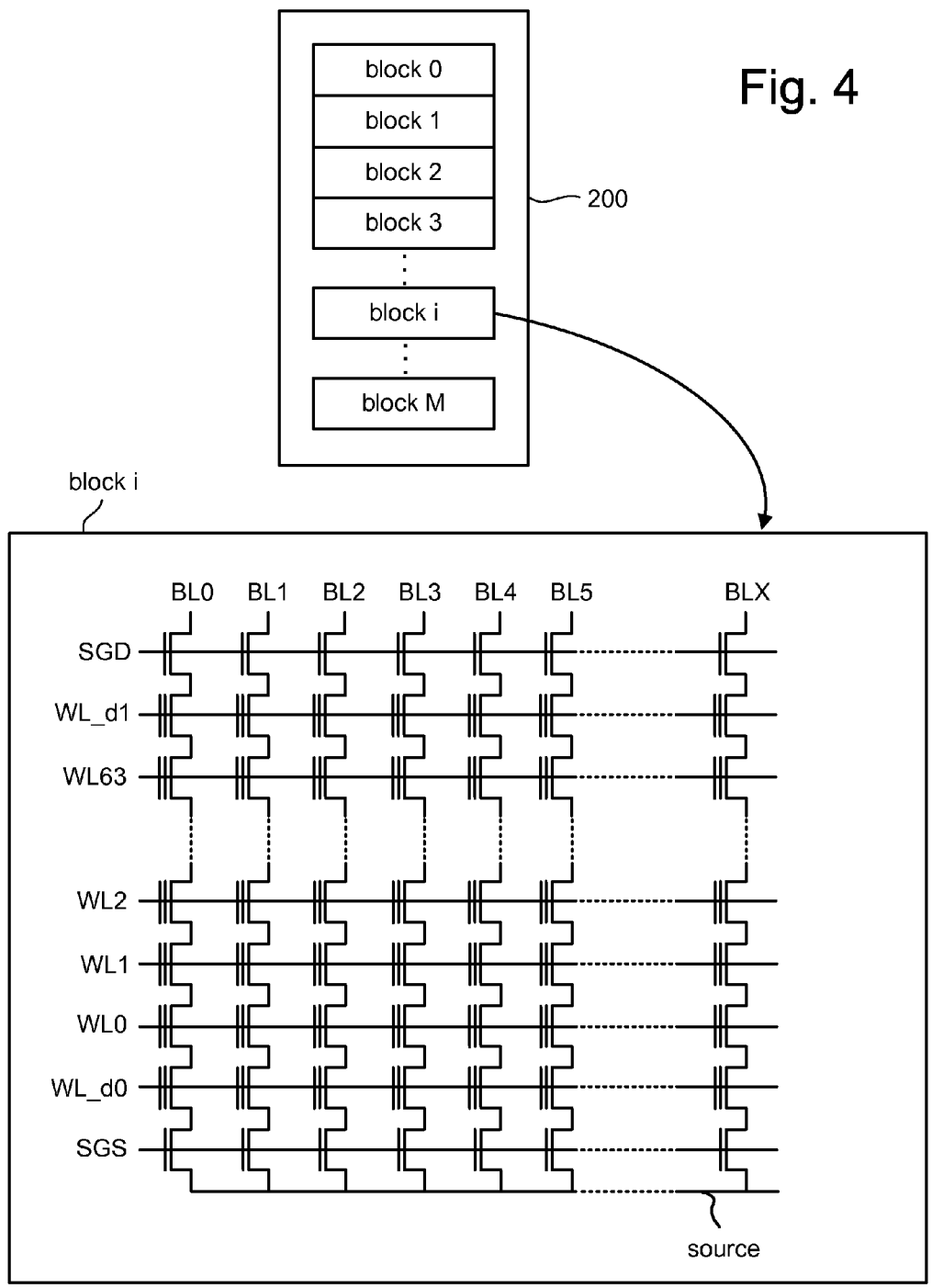
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block may be the unit of erase. That is, each block contains the minimum number of memory cells that are erased together. Each block is typically divided into a number of pages. A page may be a unit of programming. One or more pages of data may be stored in one row of memory cells. Note that it is not required that all memory cells on a given row be involved in storing a page. For example, a row of memory cells associated with even bit lines might store one set of pages, whereas memory cells in the row that are associated with odd bit lines might store another set of pages.

A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In one embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 5:
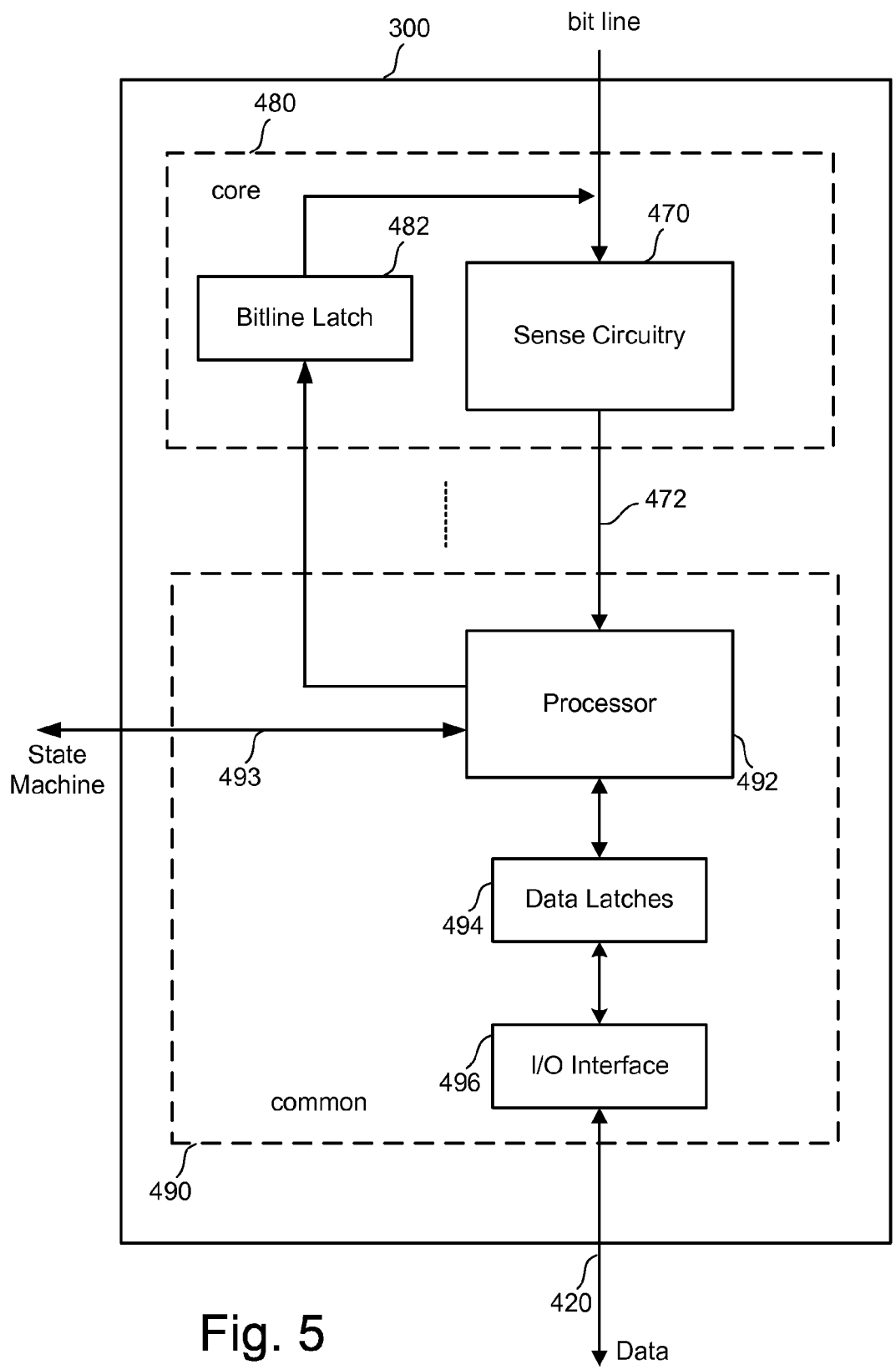
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired- OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A depicts example Vt distributions for states of memory cells in an SLC block. FIG. 6B illustrates example Vt distributions corresponding to data states for the memory cell array when each memory cell stores four bits of data. Such a distribution may be used for programming an MLC block. Other embodiments, however, may use more or fewer than four bits of data per memory cell. FIG. 6B shows 16 Vt distributions corresponding to data states 0-15. In some embodiments, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6B shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6B shows Vv1 for state 1 and Vv2 for state 2. When programming memory cells to a given state, the system will test whether those memory cells have a threshold voltage greater than or equal to the verify reference voltage.

FIG. 6C illustrates that another embodiment of Vt distributions corresponding to data states 0-15 can partially overlap because an error correction algorithm can handle a certain percentage of cells that are in error. Also note that the Vt axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Referring again to FIG. 6A, State 0 may be an erase distribution that results from erasing all memory cells in an SLC block. The erase verification voltage is not explicitly depicted but may be just at the right edge of the erase distribution. When an SLC block is programmed, the system moves the threshold voltage of selected memory cells to distribution 1. The system verifies whether memory cells are programmed to a threshold voltage of Vv for state 1. After programming has been completed, the system reads memory cells by comparing their threshold voltage with Vr.

Figure 6D:
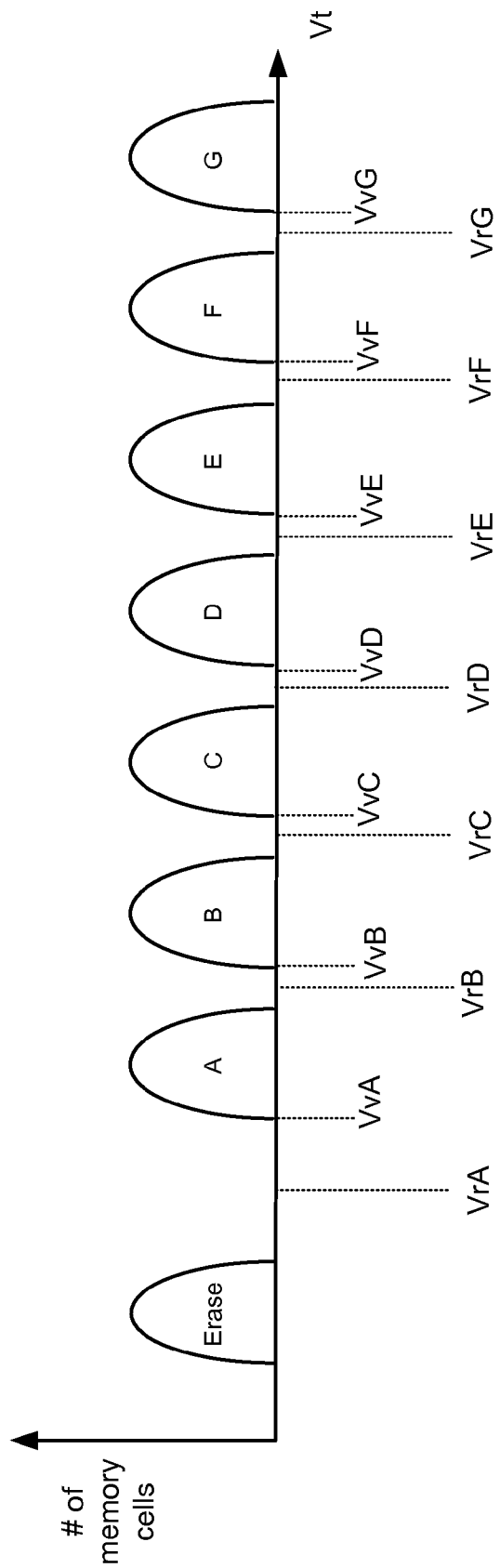

FIG. 6D depicts example threshold voltage distributions for states of memory cells in which there are eight states. This may be the case for an MLC block that stores three bits per memory cell. The eight data states include an erase state and states A-G. Between each of the data states are read reference voltages used for reading data from memory cells. For example, FIG. 6D shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 6D shows VvA for state A and VvB for state B, etc. When programming memory cells to a given state, the system will test whether those memory cells have a threshold voltage greater than or equal to the verify reference voltage.

In some embodiments, data is first programmed into SLC blocks and then at some later time, data from one or more SLC blocks is transferred to one or more MLC blocks. In some embodiments, when data is received to be stored into the memory array, it is programmed into the SLC blocks and later the MLC blocks in a manner that helps to speed up access. For example, the data may be programmed into the MLC blocks in a way that increases the probability that if memory cells associated with odd bit lines are being read, then the next data to be read during a random access is also in memory cells associated with odd bit lines. Therefore, successive reads of memory cells associated with odd bit lines (but different word lines) may be performed. Note that the next word line to be read is not required to be an adjacent word line. Rather, there might be many word lines intervening the two word lines read. In fact, the second word line that is read might even be in a different MLC block.

Figure 7A:
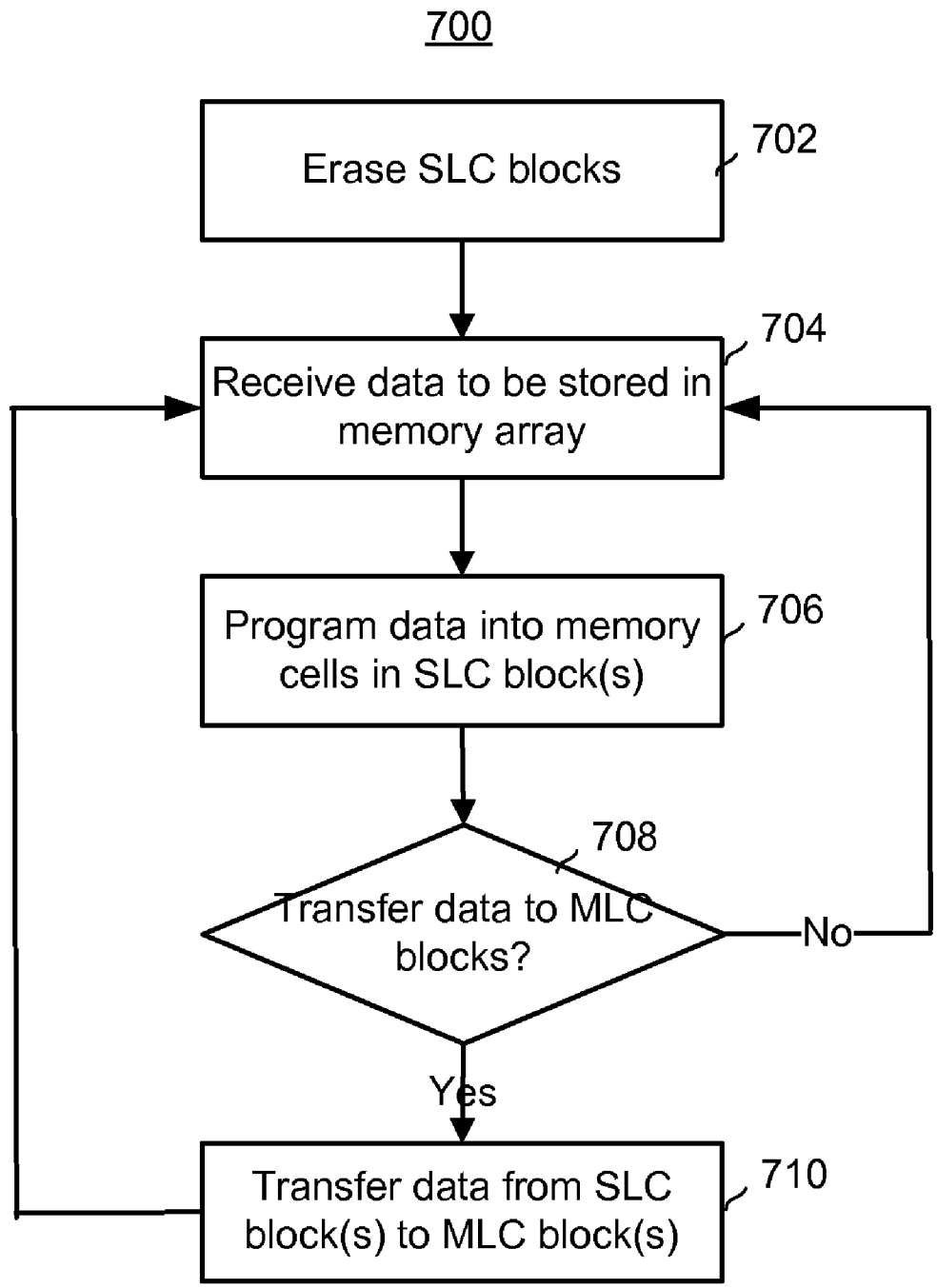
FIG. 7A is a flowchart depicting one embodiment of a process for programming SLC and MLC blocks.

FIG. 7A is a flowchart depicting one embodiment of a process 700 of programming SLC blocks and MLC blocks. In step 702, SLC blocks are erased. In step 704, the controller 244 receives data to be stored in the memory array 200. For example, a host sends the controller 244 user data to store. In process 700, the controller 244 determines that the data should first be stored in SLC blocks prior to transferring the data to MLC blocks.

In step 706, SLC block memory cells are programmed. In some embodiments, the SLC blocks are programmed in patterns such as those depicted in FIGS. 7B-7E (or another pattern). Further details of programming SLC blocks are discussed below.

In step 708, the controller 244 determines whether data from SLC blocks should be transferred to one or more MLC blocks. Note that it is not required that the entire SLC block be filled when the data is transferred. Also note that it is not required that the data from the SLC blocks be transferred to an MLC block as soon as possible. The controller 244 may wait until memory access is idle (e.g., the host is not accessing the memory array 200) to transfer data from SLC blocks to one or more MLC blocks. In this case, other SLC blocks are programmed as the controller receives more data until an appropriate time to transfer the data to MLC blocks.

When the controller 244 determines it is appropriate, data is transferred from the SLC blocks to one or more MLC blocks, in step 710. The data may be programmed into the MLC block(s) using the appropriate pattern from one of the examples of FIG. 7B-7E or some other pattern). In some embodiments, the controller 244 reads in the data from one or more SLC blocks, applies ECC to the data and then stores the data in the MLC block(s), along with the ECC codes. Note that the MLC block(s) may be erased prior to programming them.

Figure 7B:
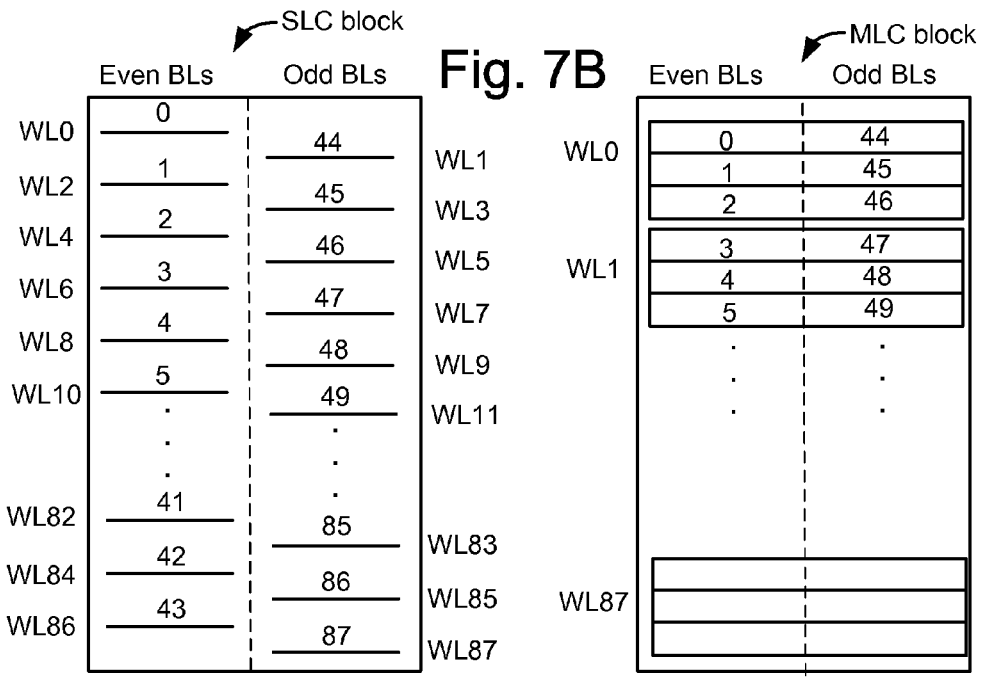
FIGS. 7B, 7C, 7D, and 7E depict example patterns in which data can be stored in SLC and MLC blocks.

FIG. 7B depicts one pattern in which data may be programmed into SLC blocks and MLC blocks. In this example, the SLC blocks are programmed in a checkerboard pattern in which memory cells associated with even bit lines are only programmed if they are on even word lines, and memory cells associated with odd bit lines are only programmed if they are on odd word lines. In this example, some unit of user data is programmed into memory cells associated with a particular word line. For purposes of discussion, that unit of user data will be referred to as a sector. The various numbers in FIG. 7B refer to which sector is stored there. For example, sector 0 is stored in memory cells on WL0 that are associated with the even bit lines; sector 1 is stored in memory cells on WL2 that are associated with the even bit lines, etc. In FIG. 7B, there are 88 sectors for purposes of illustration. Those sectors may be from one or more contiguous chunk of user data. As one example, sectors 0-43 may be from one data file and sectors 44-87 may be from a second data file.

Therefore, a contiguous chunk of data (e.g., sectors 0-43) may be stored on the even word lines of memory cells associated with even bit lines. A different contiguous chunk of data (e.g., sectors 44-87) may be stored on the odd word lines of memory cells associated with odd bit lines. For example, sector 44 is stored in memory cells on WL1 that are associated with the odd bit lines; sector 45 is stored in memory cells on WL3 that are associated with the odd bit lines, etc. Note that it is not required that the entire pattern be programmed prior to transferred the data to the MLC block. For example, it might be that the first data file is less than 43 sectors. As one example, the first data file might only go up to word line WL68. Note that a given data file could span more than one SLC block. An example if this is described below. Also, it is not an absolute requirement that the entire data file is programmed onto the same set of bit lines in all cases. For example, in some cases, most of the data file might be programmed onto the even bit lines, but some might be programmed onto the odd bit lines.

Although this is not a requirement, the data in the various sectors on the same set of bit lines (e.g., on the even bit lines) may be related. For example, the data in sector 0 to sector 43 may be instructions of a stored computer program. Note that sometimes computer executable instructions are accessed "randomly" in that after executing one or more instructions (e.g., from sector 5), it might be that the next instruction to execute comes from sector 41. Also note that it might not be possible to determine what sector the next instruction is in until the previous sector has been read and decoded. In some cases, an instruction must be executed by the computer before the address of the next instruction is known. As will be discussed more fully below, the data may be stored in the MLC blocks in a way that increases the probability that the next sector to be read is associated with even bit lines if the last sector that was read was associated with the even bit lines. As will be discussed more fully below, some embodiments include sensing techniques that speed up access when reading memory cells that are associated with the same set of bit lines (e.g., even bit lines), but are on different word lines.

Turning now to the pattern in the MLC block in FIG. 7B, each memory cell in the MLC block stores 3-bits. Word line WL0 has sectors 0-2 programmed in memory cells associated with even bit lines and sectors 44-46 programmed in memory cells associated with odd bit lines. Moreover, word line WL1 has sectors 3-5 programmed in memory cells associated with even bit lines and sectors 47-49 programmed in memory cells associated with odd bit lines. Note that because only every other word line was programmed in the SLC block, the memory cells on a given word line in the MLC block are able to contain data from up to six word lines of memory cells in the SLC block. Stated another way, a given word line in the MLC block contains six sectors of data from the SLC block.

Note that data from the even bit lines in the SLC block has been programmed to even bit lines in the MLC block, in this example. Also note that data from the odd bit lines in the SLC block has been programmed to odd bit lines in the MLC block. Moreover, in general, the sequence from the SLC block has been used in the MLC block. Note that a possible consequence of this pattern is that if the data in memory cells associated with the even bit lines in the SLC is related, then this related data will be stored in memory cells associated with even bit lines in the MLC block. A possible implication is that if two sectors of the related data are to be randomly accessed from the MLC block, those two sectors can be accessed by reading memory cells on the same set of bit lines (but different word lines). Note that the different word lines could be in different blocks.

Note that rather than programming the even bit lines in the MLC block with the data from even bit lines in the SLC block, the odd bit lines in the MLC block could be programmed with the data from even bit lines in the SLC block. In this case, the even bit lines in the MLC block could be programmed with the data from odd bit lines in the SLC block. This will still keep a given contiguous chunk of data from the SLC blocks on one or the sets of bit lines in the MLC block. For example, one data file ends up programmed on the even bit lines and another on the odd bit lines of the MLC block.

A further point to make is that the data in memory cells associated with even bit lines and a selected word line might not be related to data in memory cells associated with odd bit lines and the selected word line. For example, on WL0 of the MLC block, the data in the memory cells associated with even bit lines might be instructions for a computer program, whereas the data in the memory cells associated with odd bit lines might be user data from a spreadsheet program. The same may be true for WL1, WL2, etc. in the MLC block.

Also note that while sometimes the data in memory cells in a block that are associated with the same set of bit lines is related, this is not a requirement. For example, the data stored in memory cells on WL0 that are associated with even bit lines may or may not be related to the data stored in memory cells on WL6 of that block that are associated with the even bit lines. Note that the foregoing in this paragraph applies to both SLC blocks and MLC blocks.

Figure 7C:
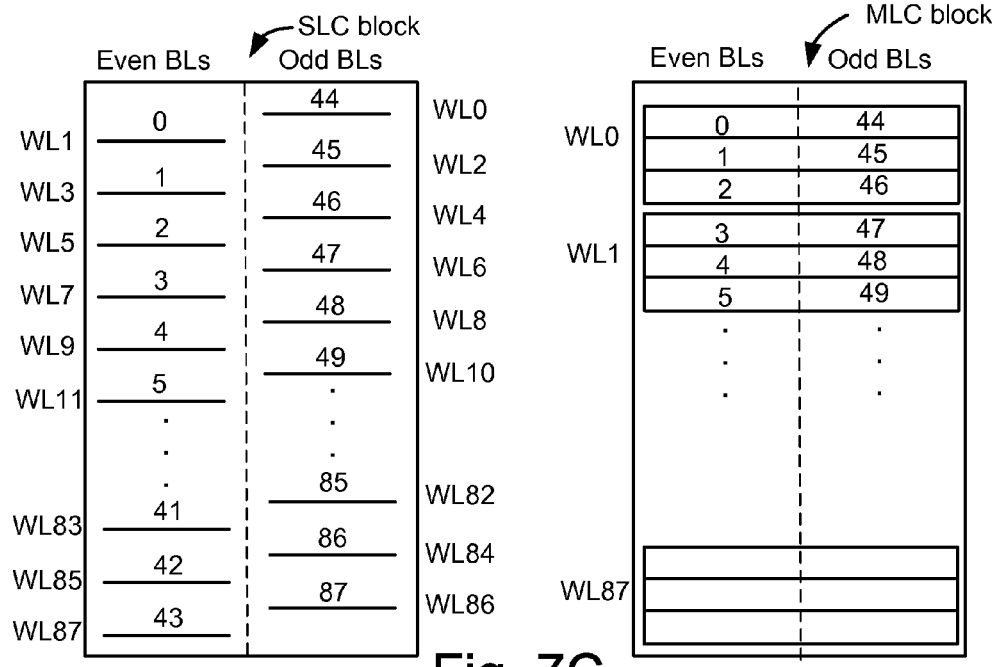

FIG. 7C depicts another example pattern for storing data in SLC blocks and MLC blocks. In this example, the SLC blocks are programmed in a checkerboard pattern in which memory cells associated with even bit lines are only programmed if they are on odd word lines, and memory cells associated with odd bit lines are only programmed if they are on even word lines. The example is similar to the one of FIG. 7B and will not be discussed in detail. The pattern in the MLC block is the same as the pattern from FIG. 7B.

Figure 7D:
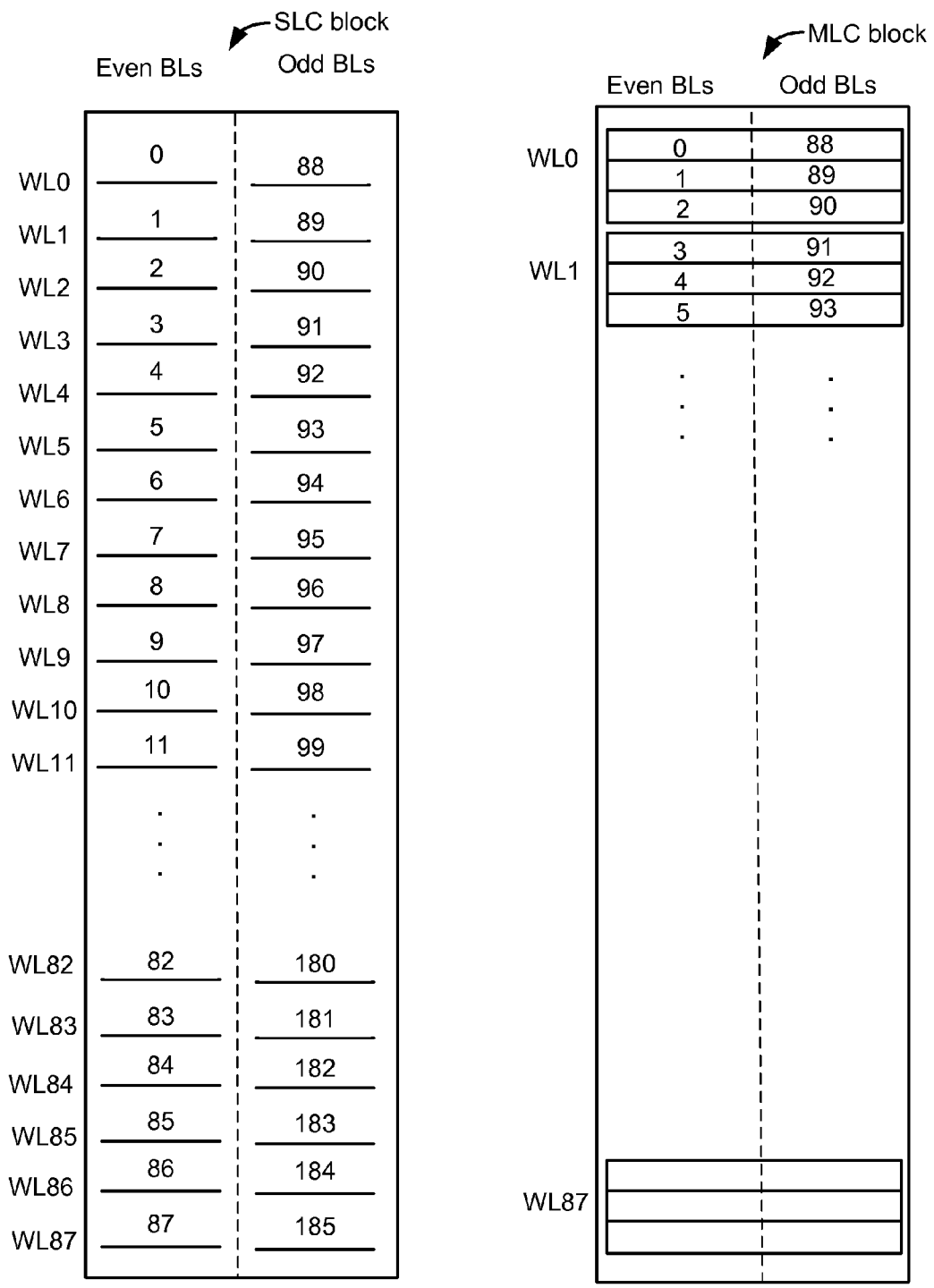

It is not required that the data be programmed in the SLC blocks in a checkerboard pattern. For example, an entire row of memory cells can be programmed. FIG. 7D depicts one example of this. In this example, the pattern of programming sectors is sector 0-sector 87 in memory cells associated with even bit lines. As depicted, both even and odd word lines may be programmed when programming memory cells associated with even bit lines, in this example. The same is true when programming memory cells associated with even odd lines. Memory cells associated with odd bit lines are programmed with sector 88 through sector 185 in this example. As with other examples herein, data in consecutive sectors may be related. For example, sectors 1-87 may from one data file, whereas sectors 88-185 may be from another data file. As with other examples, it is not required than the complete SLC block be filled with data. For example, if a data file is less than 88 sectors, then the highest number word lines might not be programmed for memory cells associated with even bit lines.

Referring now to the MLC block in FIG. 7D, sectors 0-2 are programmed into memory cells associated with the even bit lines on WL0 and sectors 88-90 are programmed into memory cells associated with the odd bit lines on WL0. Sectors 3-5 are programmed into memory cells associated with the even bit lines on WL1 and sectors 91-93 are programmed into memory cells associated with the odd bit lines on WL1. To speed up MLC programming, all bitline programming or verify can be employed to operate on MLC block programming, even though the SLC block is programmed even or odd separately. Therefore, in general, a consecutive group of sectors may be programmed into memory cells associated with the even bit lines. Likewise, a consecutive group of sectors may be programmed into memory cells associated with the odd bit lines.

Figure 7E:
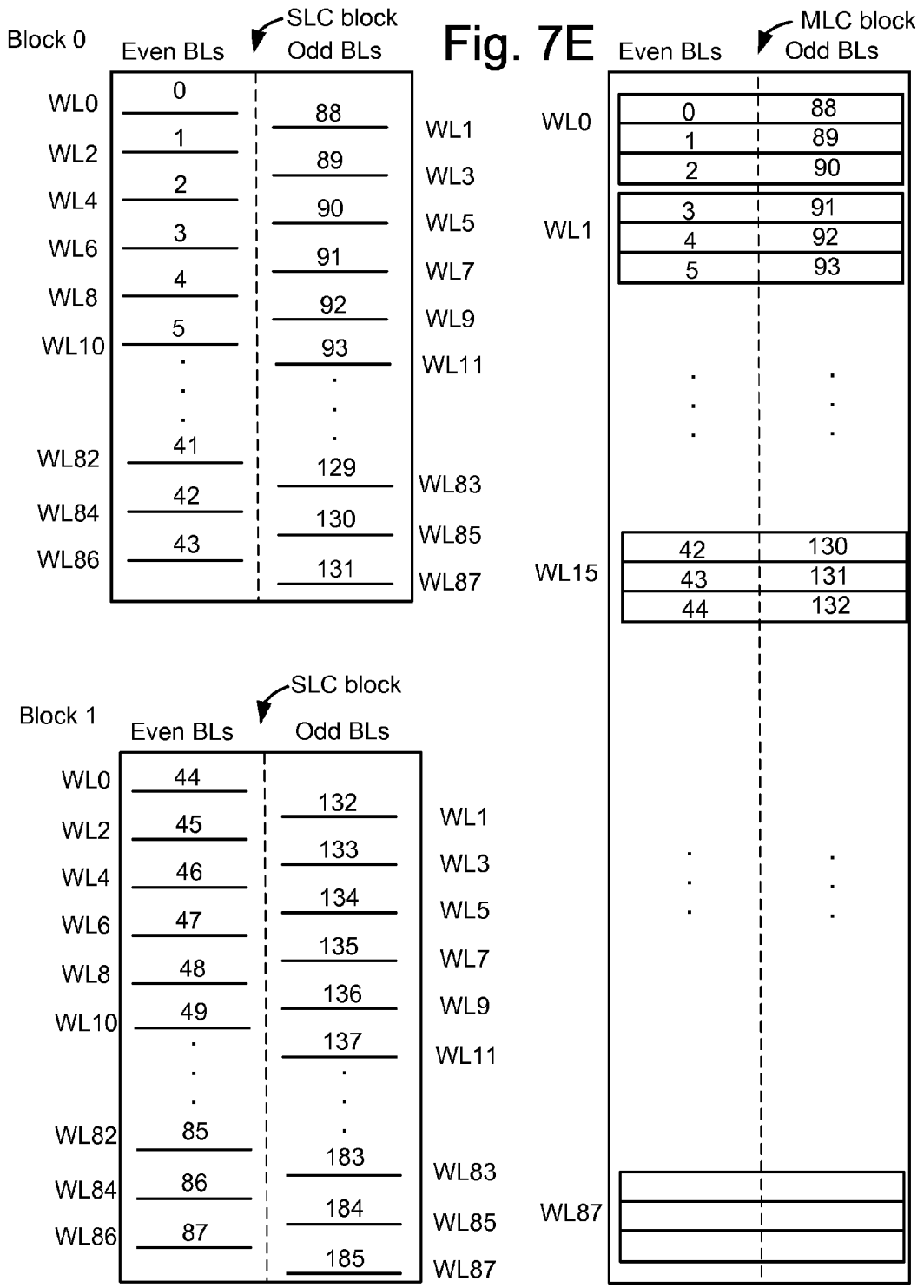

FIG. 7E depicts another example pattern for programming data into SLC blocks and MLC blocks. Two SLC blocks and one MLC block are depicted. In this example, sectors 0-43 are programmed into memory cells associated with the even bit lines in block 0, and sectors 44-87 are programmed into memory cells associated with the even bit lines in block 1. In this example, sectors 88-131 are programmed into memory cells associated with the odd bit lines in block 0, and sectors 132-185 are programmed into memory cells associated with the odd bit lines in block 1. Therefore, the set of consecutive sectors may span the same type bit lines in multiple blocks. In this example, it may be that sectors 0-87 are some contiguous chunk of data, such as a data file. Sectors 88-185 may be a different contiguous chunk of data, such as another data file. Therefore, a contiguous chunk of data can span multiple SLC blocks.

Referring now to the MLC block in FIG. 7E, sectors 0-2 are programmed into memory cells associated with the even bit lines on WL0 and sectors 88-90 are programmed into memory cells associated with the odd bit lines on WL0. Sectors 3-5 are programmed into memory cells associated with the even bit lines on WL1 and sectors 91-93 are programmed into memory cells associated with the odd bit lines on WL1. Therefore, in general, a consecutive group of sectors may be programmed into memory cells associated with the even bit lines. Likewise, a consecutive group of sectors may be programmed into memory cells associated with the odd bit lines. As with the SLC blocks, a contiguous chunk of data can span multiple MLC blocks. For example, a computer program could be stored on the even bit lines of several MLC blocks.

Note that although the examples of FIGS. 7B-7E include MLC blocks that store 3 bits per memory cells, the memory cells could store more or fewer bits per memory cell. For example, the memory cells might store 2 bits or 4 bits per memory cell.

Figure 8A:
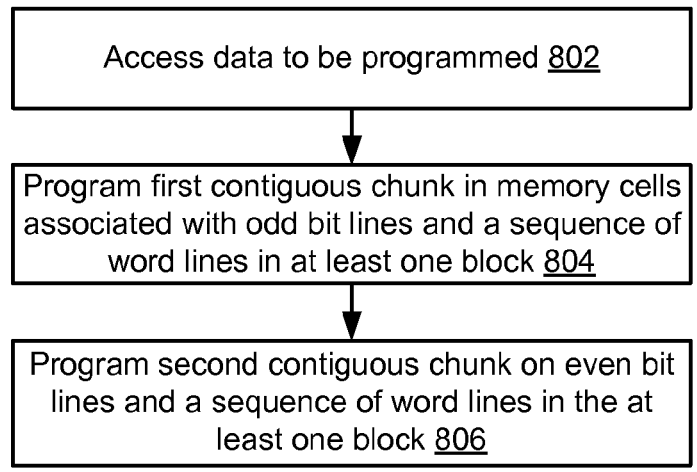
FIG. 8A id a flowchart of one embodiment of a process of programming non-volatile storage elements.

FIG. 8A depicts a flowchart of one embodiment of a process of programming non-volatile storage elements. The process may be used to program either SLC blocks or MLC blocks. In step 802, data to be programmed into non-volatile storage elements is accessed. For example, data might be sent to the controller 244 for programming into the memory array 200. However, step 802 could also include accessing data from one or more SLC blocks to be transferred to an MLC block (or MLC blocks). Note that step 802 may include accessing data at different points in time. Also note that the data may or may not be related to each other. As one example, the data could include different data files. As one particular example, one chunk of data may be instructions for a computer program and another chunk of data may be a text document.

In step 804, a first contiguous chunk of data is programmed into a first group of non-volatile storage elements associated with even bit lines. The first contiguous chunk could be a data file, as one example. The first group of storage elements are associated with a first sequence of word lines in at least one block of storage elements. For example, data is programmed into even bit lines of an SLC block, using a pattern including, but not limited to, a pattern depicted in any of FIGS. 7B-7E. As another example, data is programmed into even bit lines of an MLC block, using a pattern including, but not limited to, a pattern depicted in any of FIGS. 7B-7E. Thus, step 804 is one embodiment of step 706 and one embodiment of step 710 of process 700. Note that herein, a shorthand phrases such as "programming a word line" or "reading a word line" may be used instead of "programming memory cells associated with a word line" or "reading memory cells associated with a word line." Similarly, shorthand phrase such as "programming a bit line" or "reading a bit line" may be used instead of "programming memory cells associated with a bit line" or "reading memory cells associated with a bit line."

In step 806, a second contiguous chunk of data is programmed into a second group of non-volatile storage elements associated with odd bit lines. The second contiguous chunk could be a different data file than the one in step 804, as one example. The second group of storage elements are associated with a second sequence of word lines in the at least one block of storage elements. For example, data is programmed into odd bit lines of an SLC block, using a pattern including, but not limited to, a pattern depicted in any of FIGS. 7B-7E. As another example, data is programmed into odd bit lines of an MLC block, using a pattern including, but not limited to, a pattern depicted in any of FIGS. 7B-7E. Thus, step 806 is one embodiment of step 706 and one embodiment of step 710 of process 700.

Figure 8B:
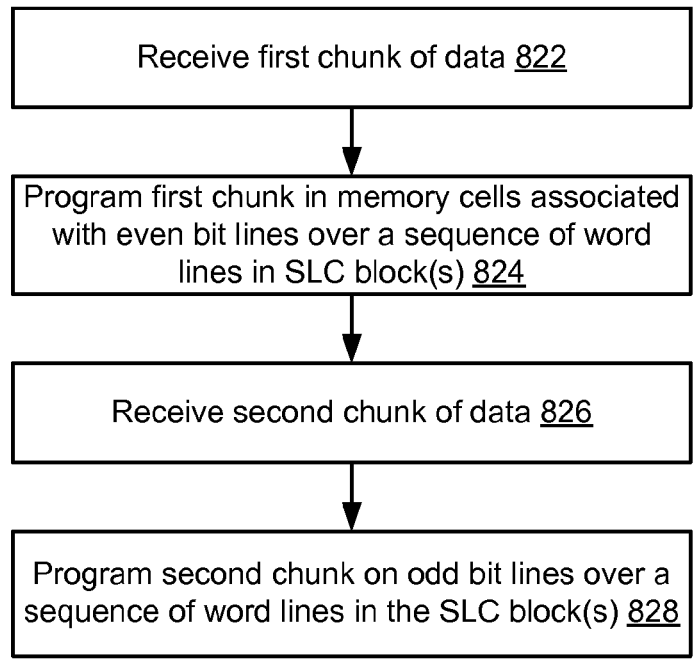
FIG. 8B depicts a flowchart of one embodiment of a process of programming SLC blocks.

FIG. 8B depicts a flowchart of one embodiment of a process 820 of programming SLC blocks. The process 820 is one embodiment of steps 704-706 of process 700. The process 820 is also one embodiment of steps 802-806 of process 800. Note that a difference between process 800 FIG. 8A and process 820 of FIG. 8B is that process 800 covers programming both SLC blocks and MLC blocks, whereas process 820 of FIG. 8B covers programming SLC blocks. Process 840 of FIG. 8C (to be discussed below) covers transferring data from SLC blocks to MLC blocks.

In step 822 of FIG. 8B, a first chunk of data to be programmed in the memory array is received. For example, the controller 244 receives user data to be programmed into the memory array. As one example, the user data could be a first data file. Step 822 is one embodiment of step 702 of process 700. Step 822 is also one embodiment of step 802 of process 800.

In step 824, the first chunk of data is programmed into a first group of non-volatile storage elements in one or more SLC blocks associated with even bit lines. The first group of storage elements are associated with a first sequence of word lines in at least one block of storage elements. For example, data is programmed into even bit lines of an SLC block, using a pattern including, but not limited to, a pattern depicted in any of FIGS. 7B-7E. In some embodiments, the received data is organized in a sequence of units (e.g., the data may be organized in a sequence of sectors). These units of data may be programmed in sequential order over the word lines, as depicted in the examples of FIGS. 7B-7E, for example.

Note that the sequence of word lines might include only even word lines (see, for example, FIG. 7B), only odd word lines (see, for example, FIG. 7C), both even and odd word lines (see, for example, FIG. 7D). The actual order in which the word lines are programmed is not critical. For example, the word lines might be programmed from low word line to high, but a different order could be used. Step 824 is one embodiment of step 706 of process 700. Step 824 is also one embodiment of step 804 of process 800.

In step 826, a second chunk of data to be programmed in the memory array 200 is received. For example, the controller 244 receives user data to be programmed into the memory array 200. As one example, the user data could be a second data file. Step 826 is one embodiment of step 702 of process 700. Step 822 is also one embodiment of step 802 of process 800.

In step 828, the second chunk of data is programmed into a second group of non-volatile storage elements in one or more SLC blocks associated with odd bit lines. The second group of storage elements are associated with a second sequence of word lines in at least one block of storage elements. Note that the second sequence of word lines may or may not include the same set of word lines as step 824. However, the second set of word lines may be in the same blocks as the first set of word lines programmed in step 824. For example, in the examples of FIGS. 7B, 7C, and 7E, the first and second sequence of word lines are not the same word lines, but they are in the same SLC blocks. However, in the example of FIG. 7D, the first and second sequence of word lines may be the same (and are also in the same SLC block). Step 824 is one embodiment of step 706 of process 700. Step 824 is also one embodiment of step 806 of process 800.

Note that it is not required that after programming one data file on even bit lines that the next data file be programmed on odd word lines. Rather, many data files could first be programmed onto the even bit lines prior to programming data on the odd bit lines. Also note that programming even bit lines in a given SLC block first was used as one example. Odd bit lines in the SLC block could be programmed prior to programming the even bit lines in the SLC block.

At some point after the data is programmed into one or more SLC blocks, the data may be transferred into one or more MLC blocks. FIG. 8C is a flowchart illustrating one embodiment of a process 840 of transferring data from one or more SLC blocks to one or more MLC blocks. Process 840 is one embodiment of step 710 of process 700. The process 840 of FIG. 8C may be performed after using the process 820 of FIG. 8B to program SLC blocks.

In step 842, data is obtained from one or more SLC blocks to be stored into one word line of an MLC block. For example, using any of the patterns from FIGS. 7B-7E, data from several SLC word lines is obtained. Using the pattern of FIG. 7B as an example, the even bit lines for WL0, WL2 and WL4 are read, as well as the odd bit lines for WL1, WL3, and WL5.

In step 844, ECC bits are calculated. In some embodiments, a separate set of ECC bits are calculated for each page to be programmed. Herein, the term "page" refers to a unit of programming. For example, when programming memory cells that store three bits per memory cells, three pages can be programmed into a group of the memory cells. Referring to FIG. 7B as one example, WL0 may contain six pages of data. For example, an upper page, middle page, and a lower page of data may be programmed on the even bit lines of WL0. Likewise, an upper, middle, and a lower page of data may be programmed on the odd bit lines of WL0. In this example, the pages correspond to the example sectors of user data. However, it is not required that a page correspond to a sector. In some embodiments, one set of ECC bits are calculated for each page.

For example, referring to the data from the SLC block in FIG. 7B, a first set of ECC bits are calculated for the data from memory cells on WL0 that are associated with even bit lines, a second set of ECC bits are calculated for the data from memory cells on WL2 that are associated with even bit lines, and a third set of ECC bits are calculated for the data from memory cells on WL4 that are associated with even bit lines. Likewise, yet another set of ECC bits are calculated for the data from memory cells on WL1 that are associated with odd bit lines, etc. This may allow a single page (which corresponds to a sector in this example) to be read back later without requiring other pages to be read. In other words, even though a MLC memory cell stores multiple bits per memory cell, in some cases a single bit can be read without reading the other bits.

In some embodiments, one set of ECC bits are calculated for the data from the memory cells associated with the even bit lines and several word lines. For example, referring to the data from the SLC block in FIG. 7B, a single set of ECC bits may be calculated for the data in memory cells on WL0, WL1, and WL2 that are associated with the even bit lines. Note that this may require that when later reading the MLC block, that all bits in each memory cell (on a selected word line) that are associated with the even bit lines should be read in order to perform the ECC check. However, the even bit lines may be read without reading the odd bit lines. Steps 842 and 843 together are one embodiment of step 802 of process 800 of accessing data to be stored.

Note that step 844 is not always required. In some cases, the SLC sectors saved in the SLC block already contain the ECC bits that are sufficient for higher error rates which may occur in MLC blocks. Therefore, the data read from SLC block in step 842 can be programmed into an MLC block directly, without re-doing the ECC decoding and encoding. In step 846, one MLC word line is programmed using the data from step 842. The ECC data that was calculated in step 844 may also be programmed into the MLC block. In some embodiments, all memory cells on the word line of the MLC block are programmed at the same time. In some embodiments, memory cells on even bit lines are programmed separately from memory cells on odd bit lines. Step 844 is one embodiment of steps 804 and 806 of FIG. 8A.

In some cases, the MLC pages on the same word line are programmed together instead of programmed page by page. For example, three pages of SLC data may be needed to program three bits per cell wordlines (WL) in the MLC block. A multiple pass program algorithm may be employed where three pages may be roughly programmed on WLn, then another three pages of data may be programmed roughly on WLn+1. Then, the same set of data may be retrieved again from the SLC block to re-program the WLn in finer steps. In this way, wordline-to-wordline coupling, as well as bitline-to-bitline coupling, can be reduced.

In step 846, if it is determined that more MLC word lines should be programmed, then the process repeats from step 842. Otherwise, the process 840 concludes.

Figure 9:
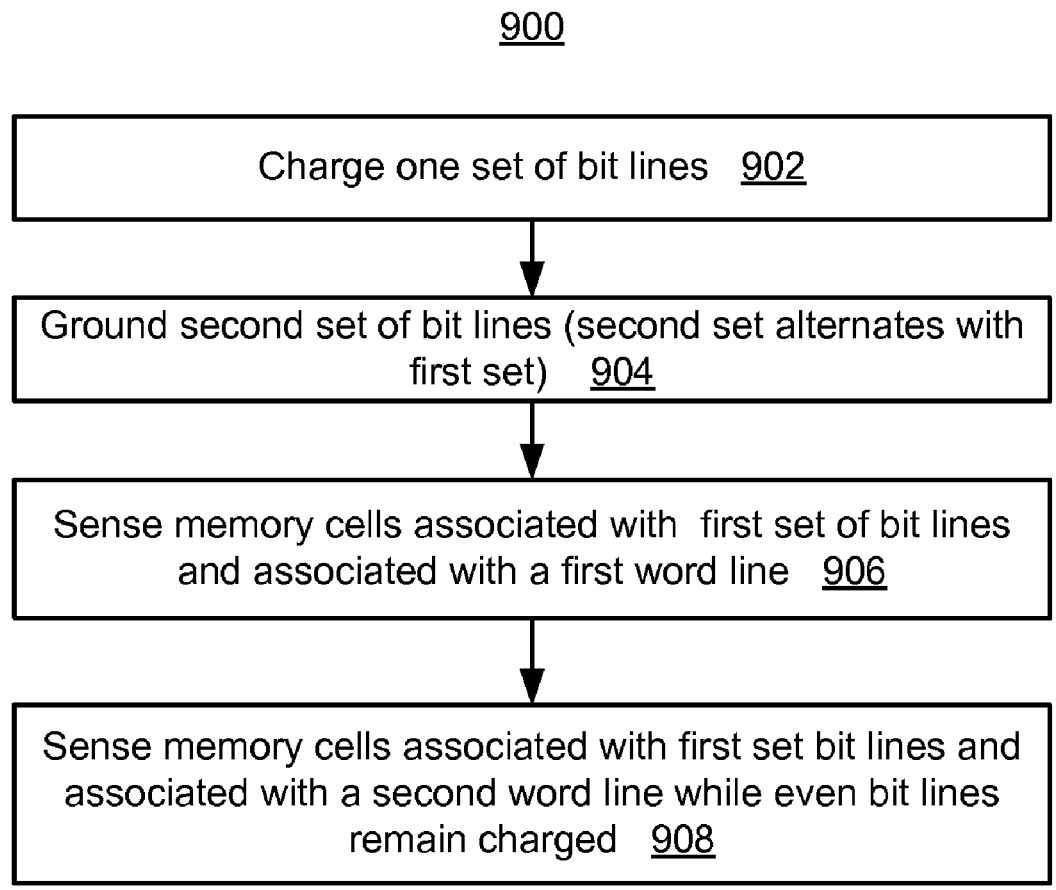
FIG. 9 is a flowchart illustrating one embodiment of a process of reading memory cells in MLC blocks.

As previously mentioned, in some embodiments, when data is read from an MLC block, the bit lines remain charged between sensing memory cells on different word lines. FIG. 9 is a flowchart illustrating one embodiment of a process 900 of reading memory cells in MLC blocks. In step 902, a first set of bit lines are charged. For example, either odd bit lines or even bit lines are charged to a suitable voltage for sensing the bit lines. The first set of bit lines are associated with a first word line and a second word line. Note that the first and second word lines may or may not be in the same MLC block. For the sake of discussion, the set of memory cells that are associated with the charged bit lines will be referred to as a first plurality of non-volatile storage elements. These storage elements may be in more than one block, as a single bit line may be associated with many blocks.

In step 904, a second set of bit lines are grounded while the first set of bit lines are charged. Individual bit lines in the second set may alternate with individual bit lines in the first set. For example, if even bit lines were charged in step 904, then odd bit lines are grounded. As another example, if odd bit lines were charged in step 904, then even bit lines are grounded. Grounding the second set of bit lines may serve as a shield to improve sensing. The second set of bit lines are associated with the first word line and the second word line. For the sake of discussion the set of memory cells that are associated with the grounded bit lines will be referred to as a second plurality of non-volatile storage elements.

In step 906, non-volatile storage elements of the first plurality of non-volatile storage elements that are associated with the first set of bit lines and are associated with the first word line are sensed. As one example, every other memory cell on a selected word line in an MLC block is sensed. The sensing occurs while the first set of bit lines remain charged. Further details of sensing bit lines are discussed below.

In step 908, non-volatile storage elements of the first plurality of non-volatile storage elements that are associated with the first set of bit lines and are associated with the second word line are sensed. As one example, every other memory cell on a different selected word line in an MLC block is sensed. Note that the MLC block in step 906 may or may not be the same MLC block that was read in step 904. The sensing occurs while the first set of bit lines remain charged. Therefore, if memory cells that are associated with even bit lines were sensed in step 904, then memory cells that are associated with even bit lines are sensed in step 906. However, the sensing occurs on different word lines. Note also that the second set of bit lines may remain grounded between steps 904-906.

In some embodiments, the word line that is read in step 908 is determined based on sensing the memory cells on the first word line in step 906. For example, the data in the memory cells on the first word line could be a computer instruction, which is read and decoded to determine the address of the next instruction. Therefore, the second word line may be determined based on sensing the first word line.

While it is not required that the MLC blocks be programmed using patterns such as depicted in FIGS. 7B-7E, the MLC blocks may be programmed with patterns such as the example patterns. If so, then sensing on different word lines (but the same set of bit lines) may improve read time when accessing data randomly. The following example of reading even bit lines in the MLC block in FIG. 7E will be used to illustrate. Recall that different sectors of user data were programmed from the SLC block to the MLC block using the pattern of FIG. 7E. When reading the MLC block, first memory cells on WL0 and that are associated with even bit lines may be sensed. Then, while the even bit lines remain charged, memory cells on WL15 and that are associated with the even bit lines may be sensed. This allows reading sectors 0-3, followed by reading sectors 42-44. As a result, the reading can skip many sectors, as not all word lines between WL0 and WL15 need to be read. Moreover, because the even bit lines do not need to be re-charged after sensing WL0, time may be saved. A reason why time may be saved is that the address of the next word line may not be know immediately after sensing the first word line.

Figure 10:
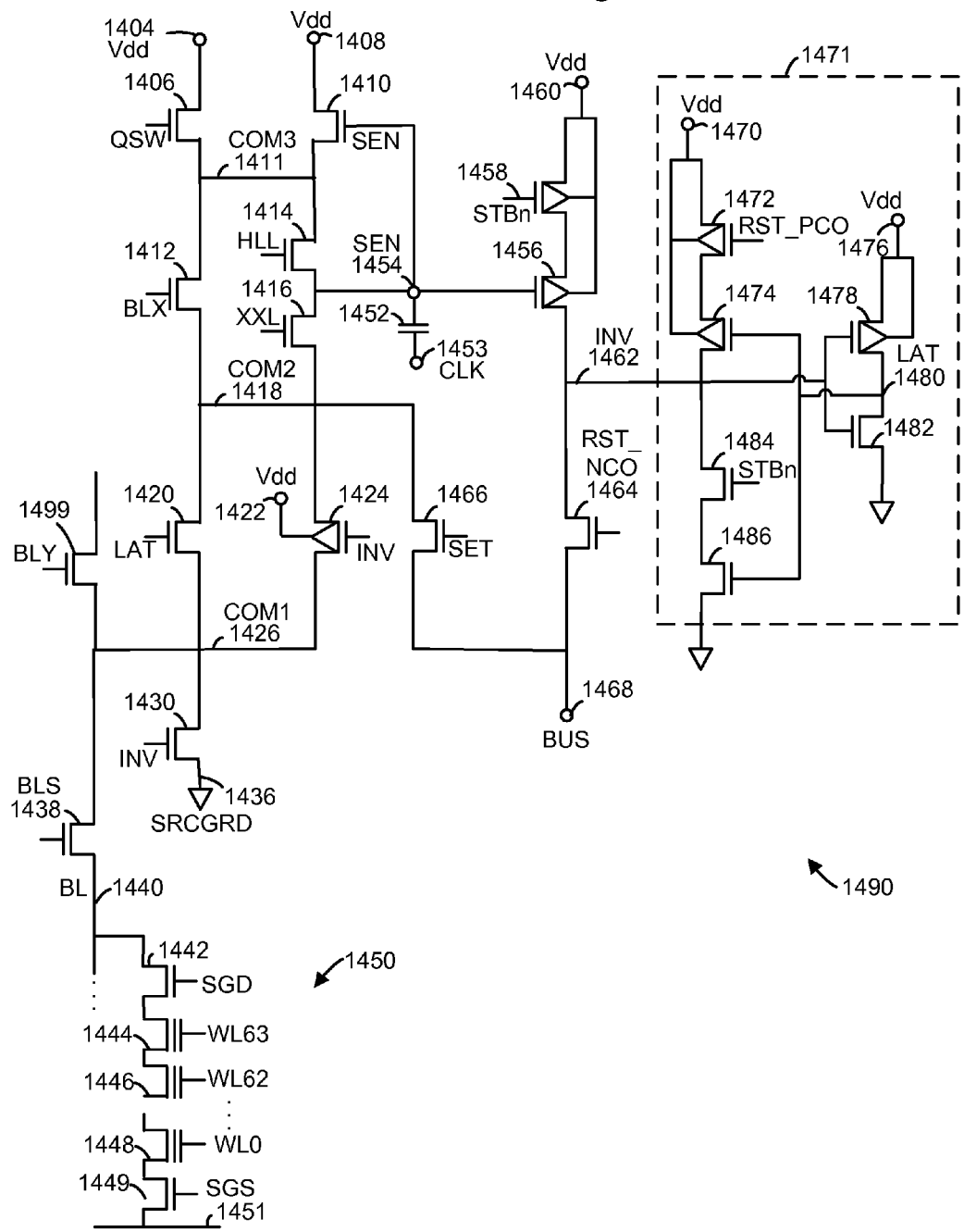
FIG. 10 depicts a sensing circuit which may be used to charge the bit lines, as well as to sense the bit lines.

FIG. 10 depicts one embodiment of a sensing circuit which may be used to charge the bit lines, as well as to sense the bit lines. The circuit is able hold the voltage on the bit line between reads of memory cells on different word lines. Therefore, the sensing circuit may be used for process 900. Various other sense circuit configurations could, however, be used. A large number of sense circuits, e.g., 64K sense circuits in a plane, typically receive common control signals unless otherwise indicated, and access one or more common power supplies. Regarding the power supply, the transistor gate voltages in the sense circuit may be provided by global circuits at the edge of large group of sense circuits. These can be high voltage such as Vdd+Vth. Since the gates may be capacitively loaded, they may use a high voltage. However, for the sense circuit drain/source voltage, the power may be limited to Vdd to avoid consuming a large amount of current.

A separate copy of the sense circuit 1490 can be provided for each bit line, and the sense circuits may be configured differently according to whether the bit line is being charged and sensed or being grounded. As noted previously, in some embodiments, even bit lines are charged and sensed while odd bit lines are grounded. Or, alternatively, odd bit lines are charged and sensed while even bit lines are grounded. One or more control circuits can communicate commands to each sense circuit to configure them appropriately, as well as to exchange data, such as read and write data.

A sense circuit can be characterized by a number of latches it provides to store data, and a number of voltages it can provide to a bit line. An example implementation includes two latches and can provide two voltages to a bit line during sensing operations. For example, bit lines being sensed can be charged to 0.4V and bit lines not being sensed could be grounded.

One latch 1471 is a full latch at LAT 1480 and its complimentary node INV 1462, and the other latch is a dynamic capacitor latch provided by capacitor 1452 with the storage node at SEN 1454 and a clock (CLK) node 1453 as a ground plate.

The transistors in the sense circuits may include nMOSFETs (nMOSs) and pMOSFETs (pMOSs), for instance. A NAND string 1450 is connected to the sense circuit 1490, and includes storage elements 1444, 1446 and 1448 in communication with word lines WL63, WL62, . . . , WL0, respectively, for example, and with a bit line (BL) 1440 via an SGD transistor 1442. The NAND string 1450 also includes a source select gate SGS 1449 connected to a common source line 1451 for multiple NAND strings. The bit line 1440 communicates with a BLS transistor 1438, which is coupled to a COM1 path 1426. The BLS transistor 1438 is a high-voltage transistor which can isolate the sense circuit, which has low voltage transistors, from high voltages of the memory array. During sensing, BLS is conductive.

The BLY transistor 1499 can pre-charge the bit line to a suitable voltage and hold that voltage. For example, the BLY transistor 1499 may be used to pre-charge the bit line to 0.4V and to hold that voltage while sensing the bit line. Note that the voltage on the bit line can be held between sensing of a memory cell on different word lines. Therefore, after the initial ramp up time of first establishing the voltage on the bit line, additional time to ramp up the voltage on the bit line is not required when reading different memory cells on the bit line. There might be a very small leakage of current on the bit line; however, this leakage may only be on the order of nano-Amperes or less. Therefore, current is not wasted to maintain the bit line voltage constant between reads of different memory cells on the bit line. The signal BLY is applied to the gate of the BLY transistor to control whether the bit lines are charged to sensing level (e.g., 0.4V) or are non-sensing level (e.g., ground).

An input to an INV transistor 1430 is an inverse of an input to a LAT transistor 1432, which receives a power supply Vdd via a terminal 1434 for the n-well of the pMOS 1432. These transistors are connected to a source ground (SRCGRD) node 1436. Similarly, an input to a LAT transistor 1420 is an inverse of an input to an INV transistor 1424, which receives Vdd via a terminal 1422 for the n-well of the pMOS 1424.

In one path, a BLX transistor 1412 extends between a COM2 path 1418, a COM3 path 1411, and a QSW transistor 1406, which in turn is connected to a power supply terminal 1404. In another path, an HLL transistor 1414 and an XXL transistor 1416 extend between the COM2 path 1418 and a SEN transistor 1410, which in turn is connected to a power supply terminal BCP 1408. The HLL transistor 1414 sets an initial voltage at the SEN node 1454 at the beginning of a sense operation to setup the voltage on the SEN node. XXL, SET and BUS are controlled in the sensing operation to determine whether SEN is discharged after a discharge period, e.g., to 0 V, or maintained at Vdd, depending on the voltage on BUS 1468.

The COM2 path 1418 is connected to a bus terminal 1468 via the SET transistor 1466 for input and output of data from SEN node 1454. The SEN node 1454 is connected to the CLK terminal 1453 via the capacitor 1452. The SEN node 1454 is also coupled to an INV path 1462 via a transistor 1456, and the INV path 1462 is coupled to the bus terminal 1468 via a reset (RST_NCO) transistor 1464. The transistor 1456 is coupled to a power supply node 1460 via a STBn transistor 1458 which receives a strobe signal during sensing. The INV path 1462 is also coupled to ground via an STBn transistor 1484 and a pull down transistor 1486. The SEN node 1454 can be inverse transferred to the INV node 1462 when STBn 1458 goes to 0 V. The INV node 1462 can be initialized to 0 V through transistor RST_NCO 1464 when BUS 1468 is at 0 V. On the other hand, if the INV node needs to be initialized to a high potential such as Vdd, the SEN node 1454 will be initialized to 0 via path XXL 1416 and SET 1466 when BUS 1468 is at 0 V.

In the latch 1471, a LAT path 1480 is an inverse of the INV path 1462. LAT 1480 is coupled to a power supply node 1476 via a transistor 1478, and to a power supply node 1470 via a transistor 1474 and a RST_PCO transistor 1472. LAT 1480 is also coupled to ground via a pull down transistor 1482. The transistor 1484 with gate STBn cut offs a "fight" between the pull up path 1456 and 1468 versus the pull down path 1484 and 1486. The transistor RST_PCO 1472 is for cutting off the pull up path when INV needs to be updated to 0 through the RST_NCO path 1464.

Figure 11A:
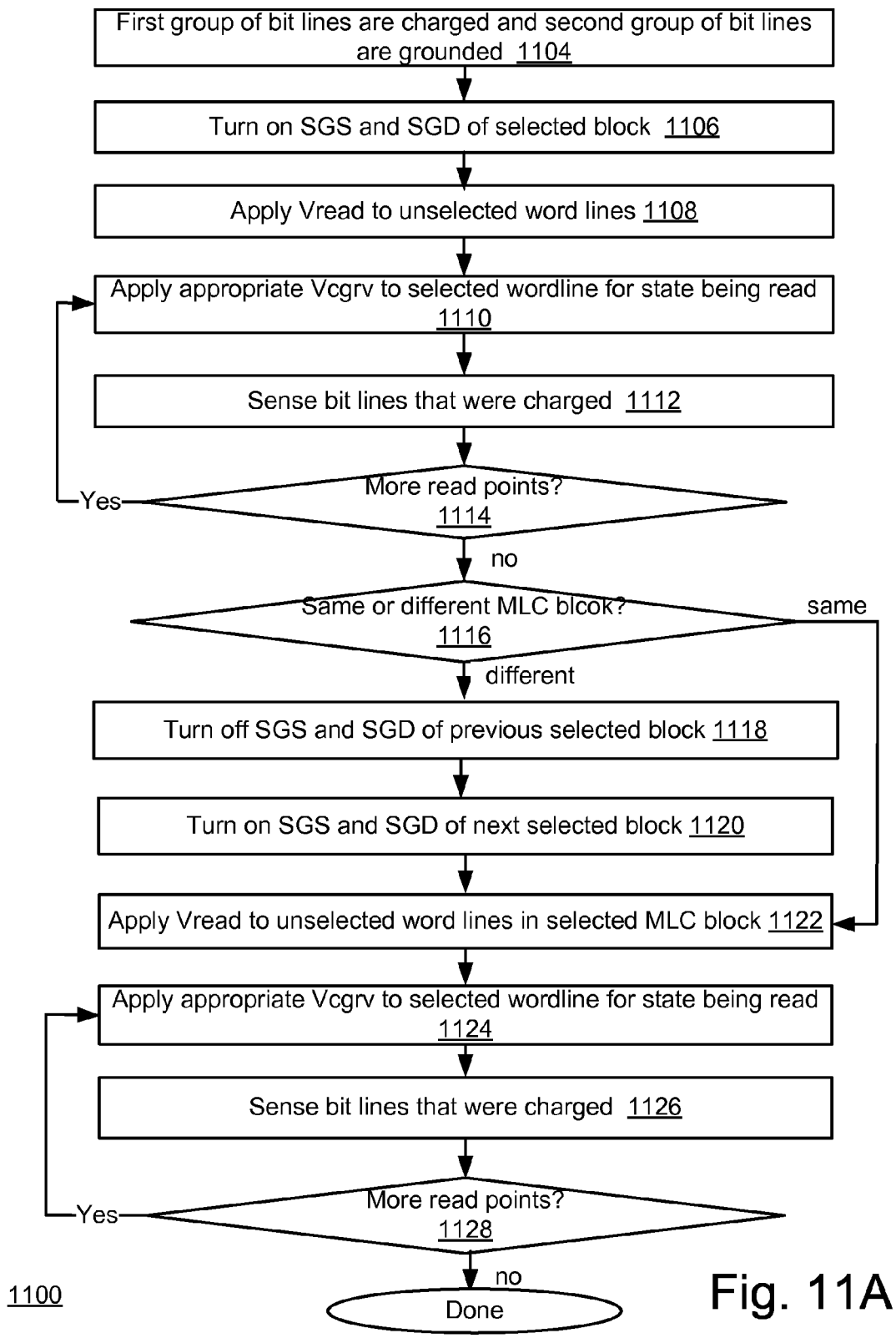
FIG. 11A is a flowchart of one embodiment of a process of reading memory cells in one or more MLC blocks.
Figure 11B:
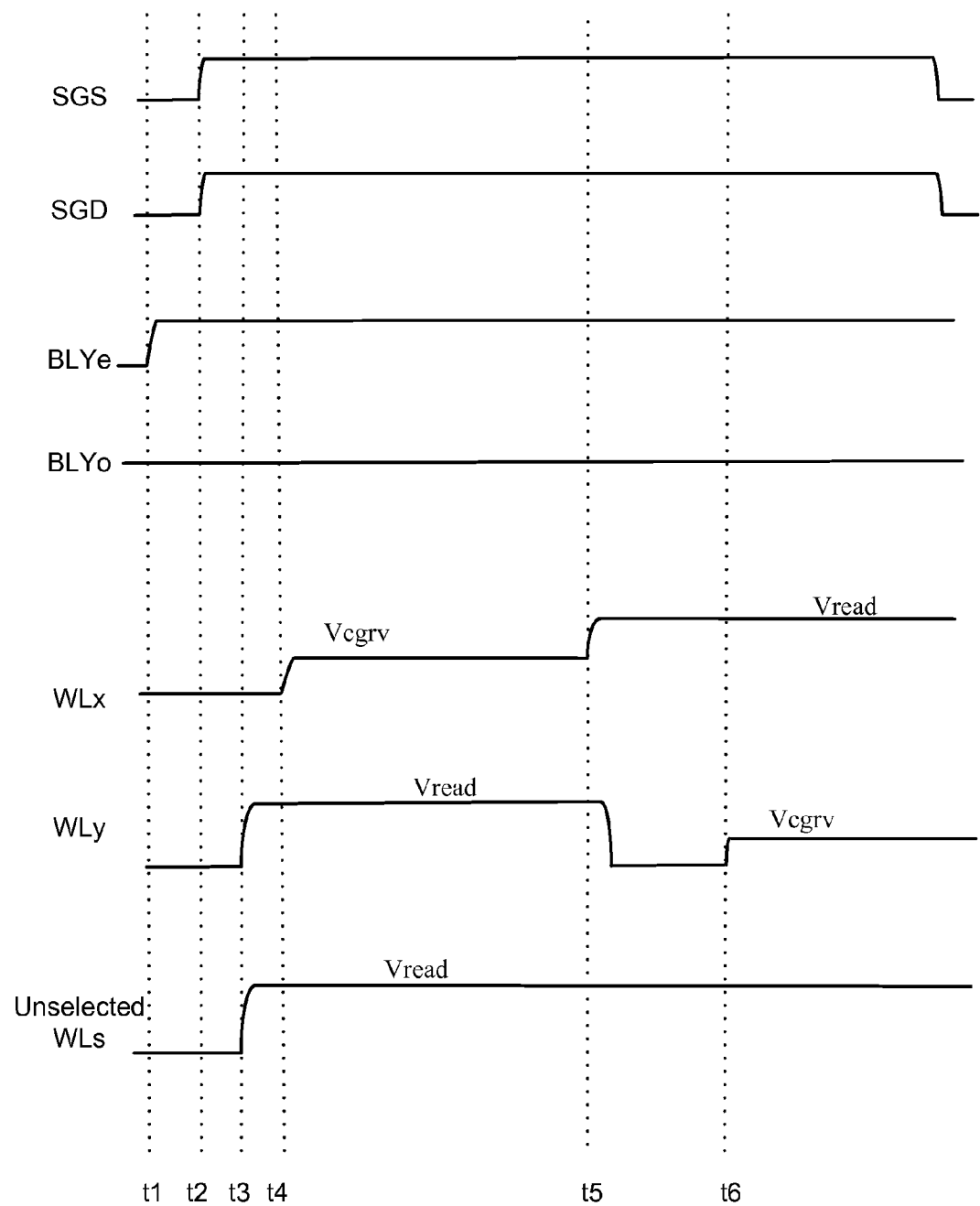
FIG. 11B is a timing diagram showing one embodiment of voltages applied during the read process of FIG. 10A.
Figure 11C:
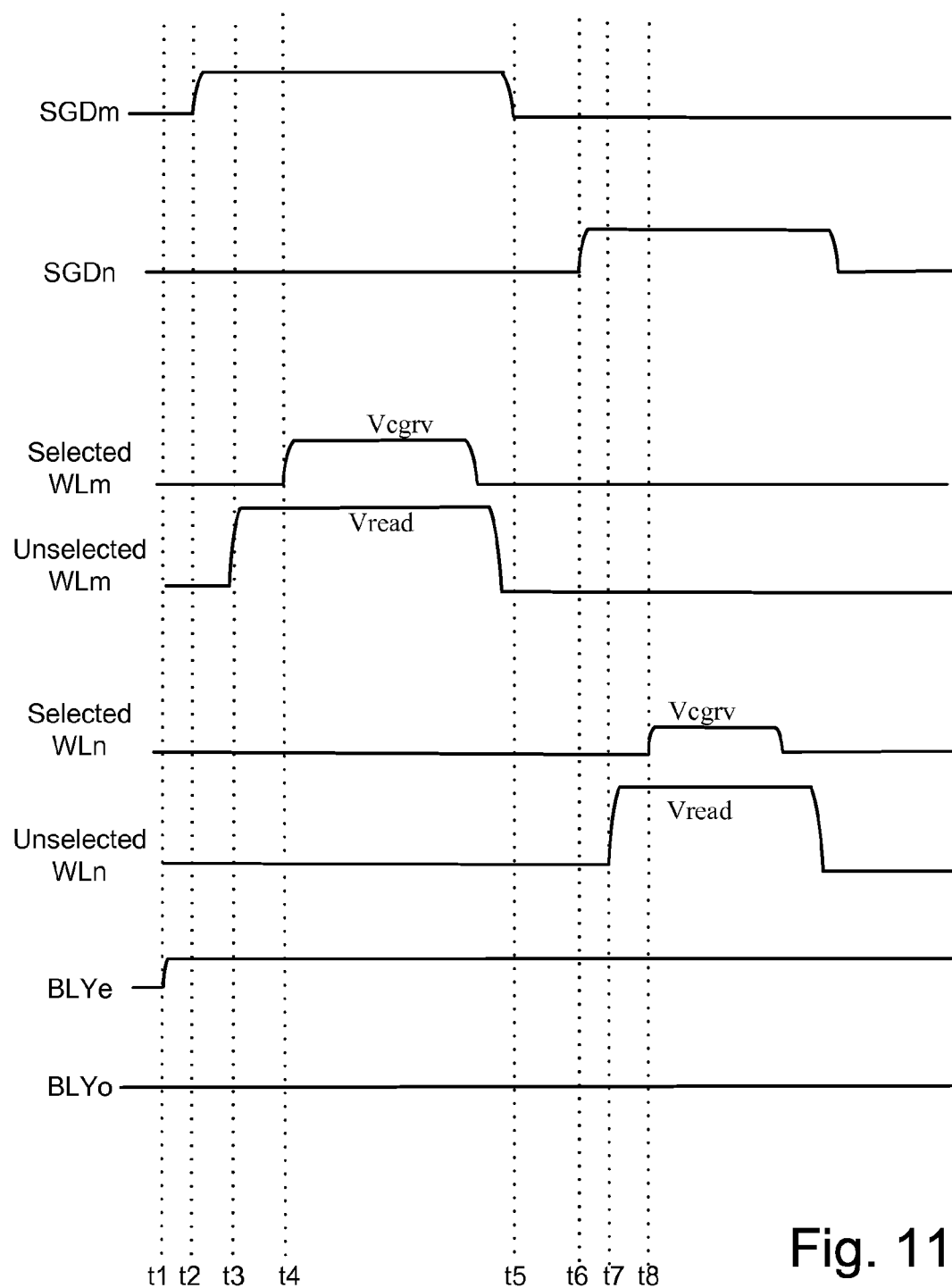
FIG. 11C depicts a timing diagram in which memory cells on word lines in different MLC blocks are read.

FIG. 11A is a flowchart of one embodiment of a process 1100 of reading memory cells in one or more MLC blocks. The timing diagrams of FIGS. 11B and 11C will be referred to when discussing process 1100. FIG. 11B is a timing diagram showing one embodiment of voltages applied during the read process of FIG. 11A. In the example of FIG. 11B, memory cells on two different word lines in the same MLC block are being read at different times. Specifically, memory cells on WLx are read, then memory cells on WLy are read. FIG. 11C depicts a timing diagram in which memory cells on word lines in different MLC blocks are read. FIG. 11C shows timing of signals for the SGD select lines (SGDm, SGDn) of two different MLC blocks (referred to as MLC block m and MLC block n). Below that are timing of signals for the selected and unselected word lines in MLC block m. Below that are timing of signals for the selected and unselected word lines in MLC block n. Below that are timing of signals for the even and odd bit lines that are associated with both MLC block m and MLC block n. In FIG. 11C, first a word line in MLC block m is read, then a word line in MLC block n is read.

In step 1104, a first set of bit lines are charged and a second set of bit lines are grounded. For example, the even bit lines are charged to a suitable voltage level for sensing memory cells and the odd bit lines are grounded. An example voltage level is 0.4V, but could be higher or lower. Referring to either FIG. 11B or 11C, the voltages on the even bit lines and the odd bit lines are established at time t1 by either signal BLYe or BLYo. As one example, BLYe is applied to the BLY transistor 1499 of sense circuits associated with even bit lines, whereas BLYo is applied to the BLY transistor 1499 of sense circuits associated with odd bit lines.

In step 1106, voltages are applied to the source side select gates (SGS) and the drain side select gates (SGD) of the selected MLC block. Referring to FIG. 11B, the signals SGS and SGS go high at time t2. The timing diagram of FIG. 11C is slightly more complex, as it involves two MLC blocks. Referring to FIG. 11C, the signal SGDm goes high at time t2 to select the NAND string in MLC block m. However, the signal SGDn remains low to keep the NAND string in MLC block n unselected. Signals applied to gates of the SGS transistors are not explicitly depicted in FIG. 11C. Note that the SGS transistors in MLC block m should be selected at time t2.

In step 1108, a read pass voltage (Vread) is applied to unselected word lines in the selected MLC block. Referring to FIG. 11B, the signal on presently unselected word line WLy is raised to Vread at time t3, as WLy is an unselected word line at this time. Also, the signal on all of the other unselected word lines is raised to Vread at time t3.

Referring to FIG. 11C, the voltage applied to the unselected word lines in selected MLC block m is raised to Vread at time t3. At this time, the voltages on all of the word lines in MLC block n may be low at this point, as MLC block n is not selected at this time.

In step 1110, a suitable read reference voltage (Vcgrv) is applied to the selected word line. For example, referring to FIG. 6D one of the read compare voltages VrA-VrG may be applied to the selected word line. Referring to FIG. 11B, the voltage on the presently selected word line WLx is raised to Vcgry at time t4. Referring to FIG. 11C, the voltage on the selected word line in MLC block m raised to Vcgry at time t4.

In step 1112, the bit lines of memory cells to be read are sensed. If the threshold voltage of a memory cell being verified is below its target state it should turn on and conduct a sizeable current, which may be detected. The sense circuit may be used to sense a signal at the sense node 1454 to determine whether or not the memory cell's current is above or below some demarcation value. For example, the sense circuit may have a capacitor 1452 that discharges (or charges) in response to the magnitude of the current flowing from the bit line. The bit line voltage may be held constant during sensing. A value may be stored in the latch (LAT) based on the reading at the sense node (SEN).

If there are more read compare points (step 1114), then the process 1100 returns to step 1110 to apply a different read reference voltage to the selected word line. For example, VrB might be applied. In some cases in which three bits are stored per memory cell, all seven read compare voltages may be applied once at a time. However, note that order in which the read compare voltages is not necessarily from VrA to VrG in sequence. Also, it is not required that all seven read compare voltages be applied. For example, for some coding schemes one of the three bits that are stored in the memory cells can be read by reading at a single read compare point. For example, for some coding techniques reading only needs to be performed at VrD to read a certain one of the three bits stored in each of the memory cells. As another example, sometimes reading at two read compare points is sufficient to be able to read one of the three bits stored in the memory cells. For example, reading only at VrB and VrF might be sufficient to read a certain one of the three bits storied in each of the memory cells. Note that the data may be read out to the BUS (FIG. 10, 1468) one or more times during the read compare process. Note that the timing diagrams of FIGS. 11B and 11C do not explicitly depict the magnitude of Vcgry changing in order to sense at different read compare points. However, it will be understood by those of ordinary skill in the art that Vcgry can shift from one magnitude to another in the timing diagrams to allow sensing at different read compare points.

When reading has been performed at all desired read compare points for the selected word line, then the process 1100 moves on to read memory cells on another word line. The other word line may be in the same or a different MLC block. If the next word line is in the same MLC block there is no need to change the voltage on to the select gate transistors SGS and SGD. However, if the next word line is in another MLC block, then the select gate transistors SGS and SGD of the previous MLC block are turned off (step 1118) and the SGS and SGS transistors are turned on in the MLC block having the next word line to be selected for reading (step 1120). For example, referring to FIG. 11C, SGDm is lowered at time t5 to de-selected MLC block m. Further, SGDn is raised at time t6 to select MLC block n.

In step 1122, a read pass voltage (Vread) is applied to unselected word lines in the presently selected MLC block. Referring to FIG. 11B, the voltage on the WLx is raised to Vread at time t5, as WLx is an unselected word line at this time. The other unselected word lines may remain at Vread.

Referring to FIG. 11C, the voltage on the unselected word lines in MLC block n are raised to Vread at time t7. At this time, the voltages on all of the word lines in MLC block m may be low, as MLC block m is not selected.

In step 1124, a suitable read reference voltage (Vcgrv) is applied to the selected word line. This step may be similar to step 1110; however, note that different read compare points may be used this time. For example, the read of the first word line might read only one page of data, which might only require reading at one read compare point. The read of the second word line might read all pages or a different set of pages. Referring to FIG. 11B, the voltage on WLy is established as Vcgry at time t6. Referring to FIG. 11C, the voltage on the selected word line in MLC block n is established at Vcgry at time t8.

In step 1126, the bit lines of memory cells to be read are sensed. If the threshold voltage of a memory cell being verified is below its target state it should turn on and conduct a sizeable current, which may be detected. Sensing may be similar to sensing of the other word line described above.

If there are more read compare points (step 1128), then the process 1100 returns to step 1124 to apply a different read reference voltage to the selected word line. For example, VrB might be applied. The process 1100 continues until sensing at all read compare points for the selected word line is complete. At some point during the read compare process, data may be read out onto the BUS.

Note that after sensing memory cells on the second word line and that are associated with the even bit lines, memory cells on additional word lines could also be read while the charge remains on the even bit lines. To do so, additional steps such as 1116-1128 could be performed. Note that the even bit lines may remain charged to the suitable sensing level in order to avoid the need to charge up the even bit lines. Likewise, odd bit lines may remain grounded. While FIGS. 11B and 11C depict timing diagram for sensing even bit lines, it will be appreciated that similar timing diagrams may apply for sensing odd bit lines.

One embodiment disclosed herein includes a method of operating non-volatile storage. The method comprises charging a first set of bit lines that are associated with a first word line and a second word line. The first set of bit lines may be associated with a first plurality of non-volatile storage elements. The method also comprises grounding a second set of bit lines while the first set of bit lines are charged. Individual bit lines in the second set may alternate with individual bit lines in the first set. The second set of bit lines may be associated with the first word line and the second word line. The second set of bit lines may be associated with a second plurality of non-volatile storage elements. The method may further include sensing non-volatile storage elements of the first plurality of non-volatile storage elements that are associated with the first set of bit lines and are associated with the first word line. The sensing may occur while the first set of bit lines remain charged. The method may further include sensing non-volatile storage elements of the first plurality of non-volatile storage elements that are associated with the first set of bit lines and are associated with the second word line. The sensing may occur while the first set of bit lines remain charged.

One embodiment disclosed herein includes a method of operating non-volatile storage. The non-volatile storage includes a plurality of non-volatile storage elements that are arranged in a plurality of blocks and a plurality of word lines associated with the plurality of non-volatile storage elements. The non-volatile storage has even bit lines and odd bit lines associated with the plurality of non-volatile storage elements.

The method includes accessing data to be programmed into the non-volatile storage, programming a first contiguous chunk of the data into a first group of the plurality of non-volatile storage elements that are associated with the even bit lines, and programming a second contiguous chunk of the data into a second group of the non-volatile storage elements associated with the odd bit lines. The first contiguous chunk of the data may be programmed over a first sequence of word lines in at least one of the blocks. The second contiguous chunk of the data may be programmed over a second sequence of word lines in the at least one block One embodiment disclosed herein includes a non-volatile storage device comprising a plurality of non-volatile storage elements, a plurality of word lines associated with the plurality of non-volatile storage elements, a first plurality of bit lines associated with a first group of the plurality of non-volatile storage elements, a second plurality of bit lines associated with a second group of the plurality of non-volatile storage elements, and one or more managing circuits in communication with the plurality of word lines and the first and second plurality of bit lines. Individual bit lines in the second plurality of bit lines alternate with individual bit lines in the first plurality of bit lines. The one or more managing circuits charge the first plurality of bit lines. The one or more managing circuits ground the second plurality of bit lines while the first plurality of bit lines are charged. The one or more managing circuits sense non-volatile storage elements in the first group that are associated with a first word line of the plurality of word lines; the sensing occurs while the first plurality of bit lines remain charged. The one or more managing circuits sense non-volatile storage elements of the first group of non-volatile storage elements that are associated with a second word line of the plurality of word lines; the sensing occurs while the first plurality of bit lines remain charged.

One embodiment includes a non-volatile storage device comprising a plurality of non-volatile storage elements that are arranged in a plurality of blocks, a plurality of word lines associated with the plurality of non-volatile storage elements, a plurality of even bit lines associated with a first set of the plurality of non-volatile storage elements, a plurality of odd bit lines associated with a second set of the plurality of non-volatile storage elements, and one or more managing circuits in communication with the plurality of word lines and the even and odd bit lines. Each of the word lines is associated with one of the blocks. The one or more managing circuits program a first contiguous chunk of the data into a first group of the plurality of non-volatile storage elements that are associated with the even bit lines and a first sequence of the word lines in at least one of the blocks. The one or more managing circuits program a second contiguous chunk of the data in a second group of the plurality of non-volatile storage elements that are associated with the odd bit lines and a second sequence of the word lines in the at least one block.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of operating non-volatile storage, the method comprising:
   charging a first set of bit lines, the first set of bit lines are associated with a first word line and a second word line, the first set of bit lines are associated with a first plurality of non-volatile storage elements;
   grounding a second set of bit lines while the first set of bit lines are charged, individual bit lines in the second set alternate with individual bit lines in the first set, the second set of bit lines are associated with the first word line and the second word line, the second set of bit lines are associated with a second plurality of non-volatile storage elements;
   sensing non-volatile storage elements of the first plurality of non-volatile storage elements that are associated with the first set of bit lines and are associated with the first word line, the sensing occurs while the first set of bit lines remain charged; and
   sensing non-volatile storage elements of the first plurality of non-volatile storage elements that are associated with the first set of bit lines and are associated with the second word line, the sensing occurs while the first set of bit lines remain charged.

2. The method of operating non-volatile storage of claim 1, wherein a first block includes both the first word line and the second word line.

3. The method of operating non-volatile storage of claim 1, wherein a first block includes the first word line and a second block includes the second word line.

4. The method of operating non-volatile storage of claim 1, wherein the first plurality of non-volatile storage elements store multiple bits per non-volatile storage element.

5. The method of operating non-volatile storage of claim 1, further including determining the second word line based on the sensing non-volatile storage elements of the first plurality of non-volatile storage elements that are associated with the first set of bit lines and are associated with the first word line.

6. The method of operating non-volatile storage of claim 5, wherein the sensing non-volatile storage elements of the first plurality of non-volatile storage elements that are associated with the first set of bit lines and are associated with the first word line includes reading a single bit per non-volatile storage element.

7. The method of operating non-volatile storage of claim 1, wherein the sensing non-volatile storage elements of the first plurality of non-volatile storage elements that are associated with the first set of bit lines and are associated with the first word line includes sensing at a plurality of read reference voltages.

8. The method of operating non-volatile storage of claim 1, wherein the sensing non-volatile storage elements of the first plurality of non-volatile storage elements that are associated with the first set of bit lines and are associated with the first word line and the sensing non-volatile storage elements of the first plurality of non-volatile storage elements that are associated with the first set of bit lines and are associated with the second word line further includes sensing while the second set of bit lines remain grounded.

9. A method of operating non-volatile storage, the method comprising:
   accessing data to be programmed into the non-volatile storage, the non-volatile storage having a plurality of non-volatile storage elements that are arranged in a plurality of blocks and a plurality of word lines associated with the plurality of non-volatile storage elements, the non-volatile storage having even bit lines and odd bit lines associated with the plurality of non-volatile storage elements;

programming a first contiguous chunk of the data into a first group of the plurality of non-volatile storage elements associated with the even bit lines, the first contiguous chunk of the data is programmed over a first sequence of word lines in at least one of the blocks; and programming a second contiguous chunk of the data into a second group of the non-volatile storage elements associated with the odd bit lines, the second contiguous chunk of the data is programmed over a second sequence of word lines in the at least one block.

10. The method of operating non-volatile storage of claim 9, wherein programming the first and second contiguous chunks of data includes programming multiple bits of data per non-volatile storage element.

11. The method of operating non-volatile storage of claim 9, wherein programming the first and second contiguous chunks of data includes programming a single bit per non-volatile storage element in at least one single-level block of the non-volatile storage elements.

12. The method of operating non-volatile storage of claim 11, wherein the first sequence of word lines includes all even word lines and no odd word lines in the at least one single-level block.

13. The method of operating non-volatile storage of claim 11, wherein the second sequence of word lines includes all odd word lines and no even word lines in the at least one single-level block.

14. The method of operating non-volatile storage of claim 11, wherein the first sequence of word lines includes all word lines in the at least one single-level block, the second sequence of word lines includes all word lines in the at least one single-level block.

15. The method of operating non-volatile storage of claim 11, further comprising:
transferring the first chunk of data from the non-volatile storage elements in the at least one single-level block to first non-volatile storage elements in a multi-level block, the first non-volatile storage elements in the multi-level block are associated with a first set of bit lines; and
transferring the second chunk of data from the non-volatile storage elements in the at least one single-level block to second non-volatile storage elements in the multi-level block, the second non-volatile storage elements in the multi-level block are associated with a second set of bit lines, individual bit lines in the second set alternate with individual bit lines in the first set.

16. The method of operating non-volatile storage of claim 9, further comprising:
charging the even bit lines, the even bit lines are associated with a first word line and a second word line of the first sequence of word lines;
grounding the odd bit lines while the even bit lines are charged, the odd bit lines are associated with the first word line and the second word line;
sensing non-volatile storage elements associated with the even bit lines and associated with the first word line, the sensing occurs while the even bit lines remain charged; and
sensing non-volatile storage elements associated with the even bit lines and associated with the second word line, the sensing occurs while the even bit lines remain charged.

17. A non-volatile storage device comprising:
a plurality of non-volatile storage elements;
a plurality of word lines associated with the plurality of non-volatile storage elements;
a first plurality of bit lines associated with a first group of the plurality of non-volatile storage elements;
a second plurality of bit lines associated with a second group of the plurality of non-volatile storage elements, individual bit lines in the second plurality of bit lines alternate with individual bit lines in the first plurality of bit lines; and
one or more managing circuits in communication with the plurality of word lines and the first and second plurality of bit lines, the one or more managing circuits charge the first plurality of bit lines, the one or more managing circuits ground the second plurality of bit lines while the first plurality of bit lines are charged, the one or more managing circuits sense non-volatile storage elements in the first group that are associated with a first word line of the plurality of word lines, the sensing occurs while the first plurality of bit lines remain charged, the one or more managing circuits sense non-volatile storage elements of the first group of non-volatile storage elements that are associated with a second word line of the plurality of word lines, the sensing occurs while the first plurality of bit lines remain charged.

18. The non-volatile storage device of claim 17, wherein the first word line and the second word line are included in the same block of non-volatile storage elements.

19. The non-volatile storage device of claim 17, wherein the first word line is included in a first block of non-volatile storage elements and the second word line is included in a second block of non-volatile storage elements.

20. The non-volatile storage device of claim 17, wherein the one or more managing circuits stores multiple bits per non-volatile storage element in the plurality of non-volatile storage elements.

21. The non-volatile storage device of claim 17, wherein the one or more managing circuits determine the second word line based on the sensing non-volatile storage elements in the first group that are associated with the first word line.

22. The non-volatile storage device of claim 21, wherein the one or more managing circuits reads a single bit per non-volatile storage element when sensing non-volatile storage elements of the first group of non-volatile storage elements that are associated with the first word line.

23. The non-volatile storage device of claim 17, wherein the one or more managing circuits sense at a plurality of read reference voltages when sensing non-volatile storage elements of the first group of non-volatile storage elements that are associated with the first word line.

24. The non-volatile storage device of claim 17, wherein the one or more managing circuits keep the second plurality of bit lines grounded between sensing the non-volatile storage elements of the first group of non-volatile storage elements that are associated with the first word line and sensing the non-volatile storage elements of the first group of non-volatile storage elements that are associated with the second word line.

25. A non-volatile storage device comprising:
a plurality of non-volatile storage elements that are arranged in a plurality of blocks;
a plurality of word lines associated with the plurality of non-volatile storage elements, each word line is associated with one of the blocks;
a plurality of even bit lines associated with a first set of the plurality of non-volatile storage elements;

a plurality of odd bit lines associated with a second set of the plurality of non-volatile storage elements; and one or more managing circuits in communication with the plurality of word lines and the even and odd bit lines, the one or more managing circuits program a first contiguous chunk of data into a first group of the plurality of non-volatile storage elements that are associated with the even bit lines and a first sequence of the word lines in at least one of the blocks, the one or more managing circuits program a second contiguous chunk of data in a second group of the plurality of non-volatile storage elements that are associated with the odd bit lines and a second sequence of the word lines in the at least one block.

26. The non-volatile storage device of claim 25, wherein the one or more managing circuits stores multiple bits per non-volatile storage element in the plurality of non-volatile storage elements to program the first and second contiguous chunks.

27. The non-volatile storage device of claim 25, wherein the at least one block is a single level block (SLC).

28. The non-volatile storage device of claim 27, wherein the first sequence of word lines includes all even word lines and no odd word lines in the at least one single-level block.

29. The non-volatile storage device of claim 27, wherein the second sequence of word lines includes all odd word lines and no even word lines in the at least one single-level block.

30. The non-volatile storage device of claim 27, wherein the first sequence of word lines includes all word lines in the at least one single-level block, the second sequence of word lines includes all word lines in the at least one single-level block.

31. The non-volatile storage device of claim 27, wherein the one or more managing circuits
transfer the first chunk of data from the non-volatile storage elements in the at least one single-level block to first non-volatile storage elements in a multi-level block, the first non-volatile storage elements in the multi-level block are associated with the even bit lines, and the one or more managing circuits transfer the second chunk of data from the non-volatile storage elements in the at least one single-level block to second non-volatile storage elements in the multi-level block, the second non-volatile storage elements in the multi-level block are associated with the odd bit lines.

32. The non-volatile storage device of claim 25, wherein the one or more managing circuits charge the even bit lines, the even bit lines are associated with a first word line and a second word line of the first sequence of word lines, the one or more managing circuits ground the odd bit lines while the even bit lines are charged, the odd bit lines are associated with the first word line and the second word line, the one or more managing circuits sense non-volatile storage elements associated with the even bit lines and associated with the first word line, the sensing occurs while the even bit lines remain charged, the one or more managing circuits sense non-volatile storage elements associated with the even bit lines and associated with the second word line, the sensing occurs while the even bit lines remain charged.

* * * * *